(12) United States Patent
Chen et al.

(10) Patent No.: US 12,176,261 B2
(45) Date of Patent: Dec. 24, 2024

(54) METHOD OF FABRICATING PACKAGE STRUCTURE

(71) Applicant: Taiwan Semiconductor Manufacturing Company, Ltd., Hsinchu (TW)

(72) Inventors: Chih-Hao Chen, Taipei (TW); Chin-Fu Kao, Taipei (TW); Li-Hui Cheng, New Taipei (TW); Szu-Wei Lu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/356,227

(22) Filed: Jul. 21, 2023

(65) Prior Publication Data

US 2023/0360995 A1 Nov. 9, 2023

Related U.S. Application Data

(60) Continuation of application No. 17/586,800, filed on Jan. 28, 2022, now Pat. No. 11,756,855, which is a division of application No. 16/745,338, filed on Jan. 17, 2020, now Pat. No. 11,239,134.

(51) Int. Cl.
*H01L 23/367* (2006.01)
*H01L 21/48* (2006.01)
*H01L 21/56* (2006.01)
*H01L 21/683* (2006.01)
*H01L 23/00* (2006.01)
*H01L 23/31* (2006.01)

(52) U.S. Cl.
CPC ...... *H01L 23/3675* (2013.01); *H01L 21/4853* (2013.01); *H01L 21/4882* (2013.01); *H01L 21/563* (2013.01); *H01L 21/6835* (2013.01); *H01L 23/3185* (2013.01); *H01L 24/16* (2013.01); *H01L 2221/68354* (2013.01); *H01L 2224/16227* (2013.01); *H01L 2924/18161* (2013.01)

(58) Field of Classification Search
CPC ............ H01L 23/3675; H01L 21/4853; H01L 21/4882; H01L 21/563; H01L 21/6835; H01L 23/3185; H01L 24/16; H01L 2221/68354; H01L 2224/16227; H01L 2924/18161
USPC ........................................................ 257/717
See application file for complete search history.

(56) References Cited

U.S. PATENT DOCUMENTS 5,585,671 A * 12/1996 Nagesh ................. H01L 23/367
257/713
6,202,765 B1 * 3/2001 Schaffer ................. E21B 21/015
55/300

(Continued)

*Primary Examiner* — Vu A Vu
(74) *Attorney, Agent, or Firm* — JCIPRNET

(57) ABSTRACT

A structure includes a circuit substrate, a device, a metal layer, a lid and a thermal interface material layer. The device is disposed on and electrically connected to the circuit substrate. The device includes at least one semiconductor die laterally encapsulated by an insulating encapsulation. The metal layer is covering a back surface of the at least one semiconductor die and the insulating encapsulation. The lid is disposed on the circuit substrate, and the lid is adhered to the metal layer through the thermal interface material layer.

20 Claims, 37 Drawing Sheets

(56) References Cited

U.S. PATENT DOCUMENTS

| | | | | |
|---|---|---|---|---|
| 6,229,216 B1 * | 5/2001 | Ma | H01L 23/49827 | 257/722 |
| 6,848,172 B2 * | 2/2005 | Fitzgerald | H01L 23/367 | 716/132 |
| 7,031,162 B2 * | 4/2006 | Arvelo | H01L 23/3675 | 257/713 |
| 7,186,590 B2 * | 3/2007 | Alcoe | H01L 23/427 | 257/E23.101 |
| 7,476,967 B2 * | 1/2009 | Dubin | H01L 23/433 | 257/E23.09 |
| 8,202,765 B2 * | 6/2012 | Casey | H01L 23/04 | 257/E23.101 |
| 8,283,776 B2 * | 10/2012 | Chandrasekaran | H01L 23/367 | 257/713 |
| 8,304,291 B2 * | 11/2012 | Touzelbaev | B23K 1/0016 | 257/706 |
| 8,456,000 B2 * | 6/2013 | Baek | H05K 1/189 | 257/730 |
| 8,508,040 B2 * | 8/2013 | Start | H01L 23/42 | 257/E23.092 |
| 8,802,504 B1 | 8/2014 | Hou et al. | | |
| 8,803,292 B2 | 8/2014 | Chen et al. | | |
| 8,803,316 B2 | 8/2014 | Lin et al. | | |
| 8,962,394 B2 * | 2/2015 | Ihara | H01L 21/4875 | 438/122 |
| 8,993,380 B2 | 3/2015 | Hou et al. | | |
| 9,269,694 B2 * | 2/2016 | Chen | H01L 23/3675 | |
| 9,281,254 B2 | 3/2016 | Yu et al. | | |
| 9,299,649 B2 | 3/2016 | Chiu et al. | | |
| 9,372,206 B2 | 6/2016 | Wu et al. | | |
| 9,425,126 B2 | 8/2016 | Kuo et al. | | |
| 9,443,783 B2 | 9/2016 | Lin et al. | | |
| 9,496,189 B2 | 11/2016 | Yu et al. | | |
| 9,935,090 B2 * | 4/2018 | Yu | H01L 24/96 | |
| 10,032,692 B2 | 7/2018 | Kalchuri | H01L 25/16 | |
| 10,707,196 B2 * | 7/2020 | Kim | H01L 25/18 | |
| 11,075,138 B2 * | 7/2021 | Kwon | H01L 24/09 | |
| 11,264,337 B2 * | 3/2022 | Chang | H01L 23/36 | |
| 11,494,682 B2 * | 11/2022 | Elsherbini | H01L 25/18 | |

\* cited by examiner

METHOD OF FABRICATING PACKAGE STRUCTURE

CROSS-REFERENCE TO RELATED APPLICATION

This application is a continuation application of and claims the priority benefit of U.S. application Ser. No. 17/586,800, filed on Jan. 28, 2022, now allowed. The prior U.S. application Ser. No. 17/586,800 is a divisional application of and claims the priority benefit of U.S. application Ser. No. 16/745,338, filed on Jan. 17, 2020, which is patented as U.S. Pat. No. 11,239,134. The entirety of each of the above-mentioned patent applications is hereby incorporated by reference herein and made a part of this specification.

BACKGROUND

Semiconductor devices and integrated circuits used in a variety of electronic applications, such as cell phones and other mobile electronic equipment, are typically manufactured on a single semiconductor wafer. The dies of the wafer may be processed and packaged with other semiconductor devices or dies at the wafer level, and various technologies have been developed for the wafer level packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1A:
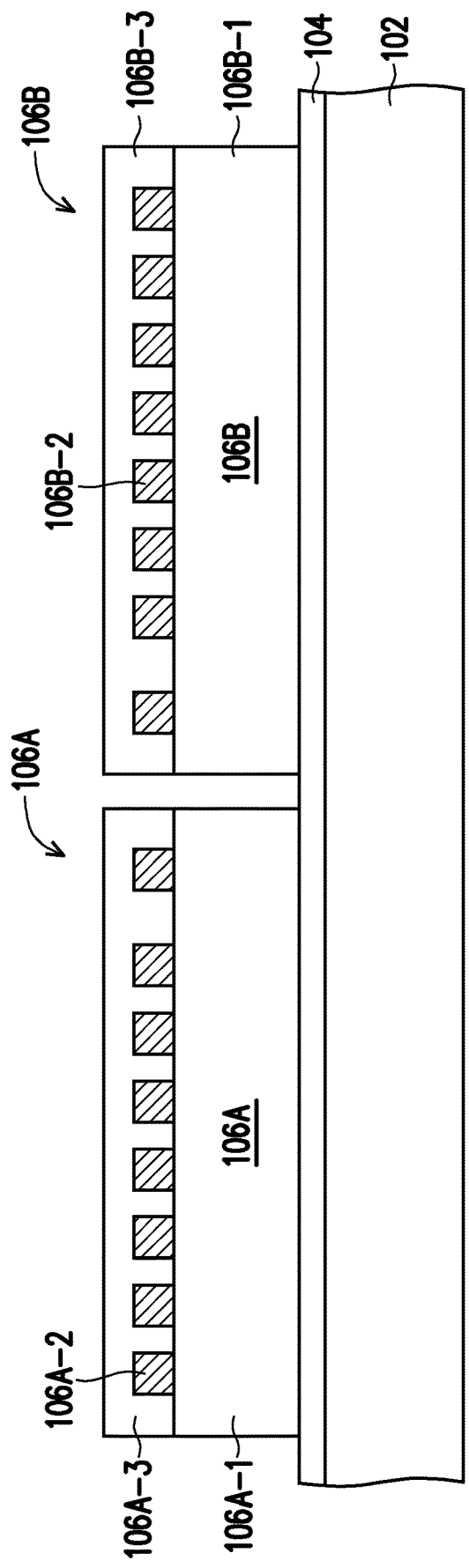
FIG. 1A to FIG. 1K are schematic sectional views of various stages in a method of fabricating a device according to some exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1K are schematic sectional views of various stages in a method of fabricating a device according to some exemplary embodiments of the present disclosure. Referring to FIG. 1A, a carrier 102 is provided. In some embodiments, the carrier 102 may be a glass carrier or any suitable carrier for carrying a semiconductor wafer or a reconstituted wafer in the manufacturing method of the device. In some embodiments, the carrier may be coated with a debond layer 104. The material of the debond layer 104 may be any material suitable for bonding and de-bonding the first carrier 102 from the above layer(s) or any wafer(s) disposed thereon.

In some embodiments, the debond layer 104 may include a dielectric material layer made of a dielectric material including any suitable polymer-based dielectric material (such as benzocyclobutene ("BCB"), polybenzoxazole ("PBO")). In an alternative embodiment, the debond layer 104 may include a dielectric material layer made of an epoxy-based thermal-release material, which loses its adhesive property when heated, such as a light-to-heat-conversion (LTHC) release coating film. In a further alternative embodiment, the debond layer 104 may include a dielectric material layer made of an ultra-violet (UV) glue, which loses its adhesive property when exposed to UV lights. In certain embodiments, the debond layer 104 may be dispensed as a liquid and cured, or may be a laminate film laminated onto the carrier 102, or may be the like. The top surface of the debond layer 104, which is opposite to a bottom surface contacting the carrier 102, may be levelled and may have a high degree of coplanarity. In certain embodiments, the debond layer 104 is, for example, a LTHC layer with good chemical resistance, and such layer enables room temperature de-bonding from the carrier 102 by applying laser irradiation, however the disclosure is not limited thereto.

As illustrated in FIG. 1A, a plurality of semiconductor dies (106A and 106B) is disposed on the carrier 102. For example, a first die 106A and a second die 106B are picked and placed on the carrier 102. In some embodiments, the first die 106A and the second die 106B are attached to the debond layer 104 through an adhesive layer (not shown). The adhesive layer may be a die attach film (DAF) or other suitable bonding layers. The first die 106A and the second die 106B are located adjacent to one another on the debond layer 104 while a gap exist in between the first die 106A and the second die 106B.

In some embodiments, the first die 106A includes a semiconductor substrate 106A-1, conductive pillars 106A-2, and a protection layer 106A-3. The semiconductor substrate 106A-1 may be a bulk silicon substrate or a silicon-on-insulator (SOI) substrate, and further includes active components (e.g., transistors or the like) and optionally passive components (e.g., resistors, capacitors, inductors or the like) formed therein. In some embodiments, the conductive pillars 106A-2 are distributed on and electrically connected to the semiconductor substrate 106A-1. In some embodiments, a material of the conductive pillars 106A-2 may include solder, gold, copper, or other suitable conductive materials. Furthermore, the conductive pillars 106A-2 may be formed by an electroplating process or other suitable deposition process. In some embodiments, the protection layer 106A-3 is formed over the semiconductor substrate 106A-1 and covers the conductive pillars 106A-2 to protect the conductive pillars 106A-2. In certain embodiments, the protection layer 106A-3 may include materials such as polybenzoxazole, polyimide, a suitable organic or inorganic material, or the like.

In some embodiments, the second die 106B includes a similar or the same structure as the first die 106A. For example, the second die 106B includes a semiconductor substrate 106B-1, conductive pillars 106B-2, and a protection layer 106B-3. The semiconductor substrate 106 B-1 may be a bulk silicon substrate or a silicon-on-insulator (SOI) substrate, and further includes active components (e.g., transistors or the like) and optionally passive components (e.g., resistors, capacitors, inductors or the like) formed therein. In some embodiments, the conductive pillars 106B-2 are distributed on and electrically connected to the semiconductor substrate 106B-1. In some embodiments, a material of the conductive pillars 106B-2 may include solder, gold, copper, or other suitable conductive materials. Furthermore, the conductive pillars 106B-2 may be formed by an electroplating process or other suitable deposition process. In some embodiments, the protection layer 106B-3 is formed over the semiconductor substrate 106B-1 and covers the conductive pillars 106B-2 to protect the conductive pillars 106B-2. In certain embodiments, the protection layer 106B-3 may include materials such as polybenzoxazole, polyimide, a suitable organic or inorganic material, or the like.

The first die 106A and the second die 106B may be the same type of semiconductor dies or the different types of semiconductor dies. In some embodiments, the first die 106A and the second die 106B may be selected from application-specific integrated circuit (ASIC) dies, analog dies (for example, wireless and radio frequency chips), digital dies (for example, a baseband chip), integrated passive devices (IPDs), voltage regulator dies, sensor dies, memory dies, or the like. The disclosure is not limited thereto. In certain embodiments, at least one of the first die 106A and the second die 106B includes a memory die such as high bandwidth memory (HBM) die.

Figure 1B:
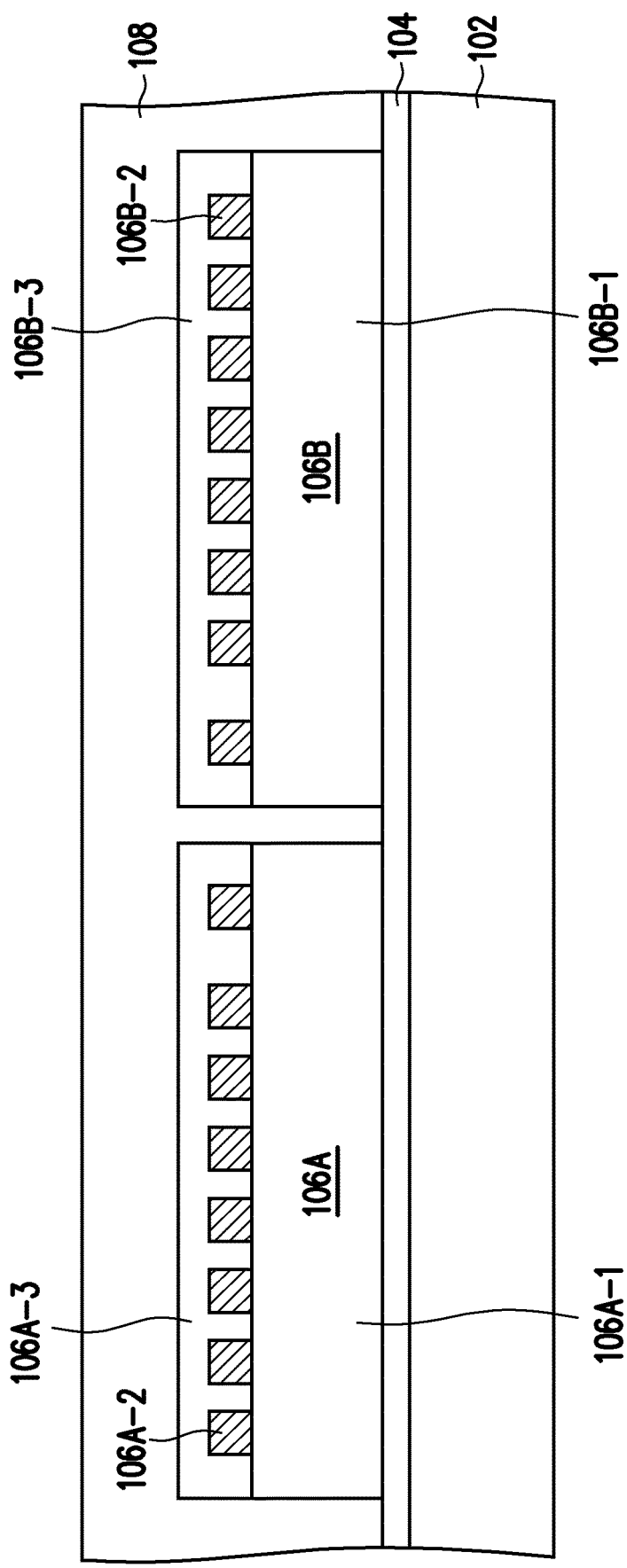

Referring to FIG. 1B, in some embodiments, after placing the first die 106A and the second die 106B over the carrier 102, an insulating material 108 is formed on the debond layer 104 and over the carrier 102. In some embodiments, the insulating material 108 is formed to cover the first die 106A and the second die 106B. In some embodiments, the insulating material 108 is formed through, for example, a compression molding process, filling up the gaps between the first die 106A and the second die 106B. At this stage, the conductive pillars (106A-2, 106B-2) and the protection layer (106A-3, 106B-3) are encapsulated by and well protected by the insulating material 108. In other words, the conductive pillars (106A-2, 106B-2) and the protection layer (106A-3, 106B-3) are not revealed by the insulating material 108.

In some embodiments, the insulating material 108 includes polymers (such as epoxy resins, phenolic resins, silicon-containing resins, or other suitable resins), dielectric materials having low permittivity (Dk) and low loss tangent (Df) properties, or other suitable materials. In an alternative embodiment, the insulating material 108 may include an acceptable insulating encapsulation material. In some embodiments, the insulating material 108 may further include inorganic filler or inorganic compound (e.g. silica, clay, and so on) which can be added therein to optimize coefficient of thermal expansion (CTE) of the insulating material 108. The disclosure is not limited thereto.

Figure 1C:
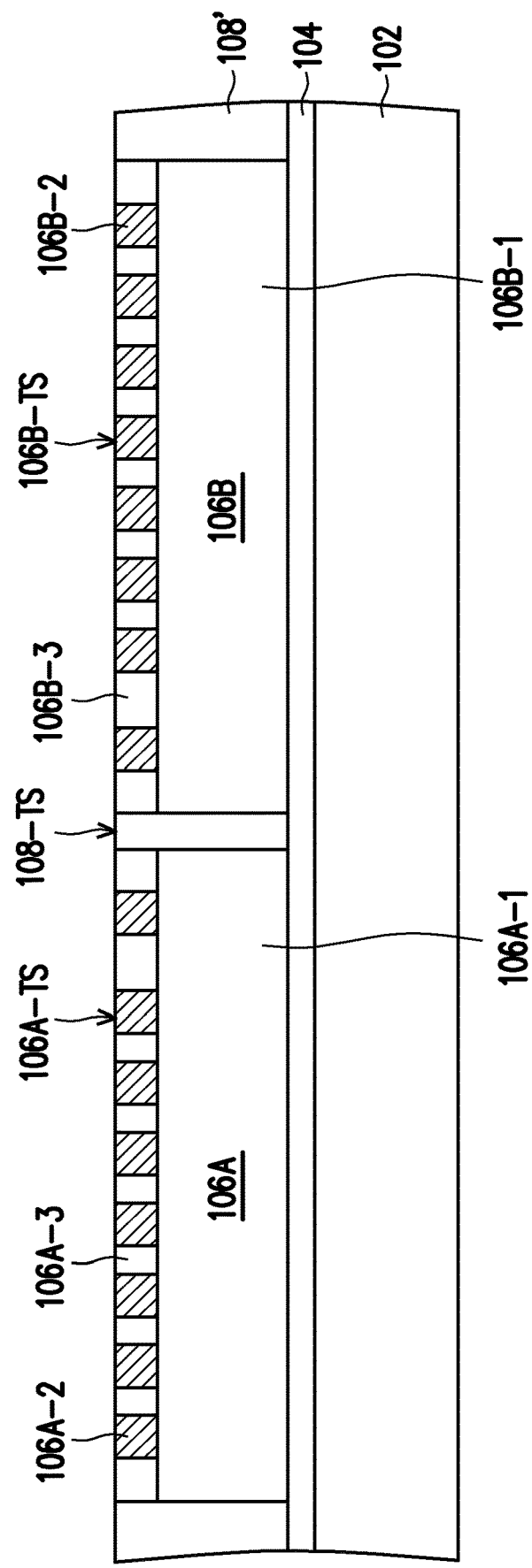

Referring to FIG. 1C, in some embodiments, the insulating material 108 is partially removed to reveal the conductive pillars 106A-2 of the first die 106A and the conductive pillars 106B-2 of the second die 106B. In some embodiments, the insulating material 108 is ground or polished by a planarization step. For example, the planarization step is performed through a mechanical grinding process and/or a chemical mechanical polishing (CMP) process until a top surface 106A-TS of the conductive pillars 106A-2 and a top surface 106B-TS of the conductive pillars 106B-2 are revealed. In some embodiments, the conductive pillars 106A-2 and the conductive pillars 106B-2 may also be slightly grinded/polished.

In the illustrated embodiment, the insulating material 108 is polished to form an insulating encapsulation 108'. In some embodiments, an upper surface 108-US of the insulating encapsulation 108', the top surface 106A-TS of the conductive pillars 106A-2 and the top surface 106B-TS of the conductive pillars 106B-2 are coplanar and levelled with one another. In certain embodiments, the first die 106A and the second die 106B are laterally encapsulated by the insulating encapsulation 108'. In some embodiments, after the mechanical grinding or chemical mechanical polishing (CMP) steps, a cleaning step may be optionally performed. For example, the cleaning step is preformed to clean and remove the residue generated from the planarization step. However, the disclosure is not limited thereto, and the planarization step may be performed through any other suitable methods.

Figure 1D:
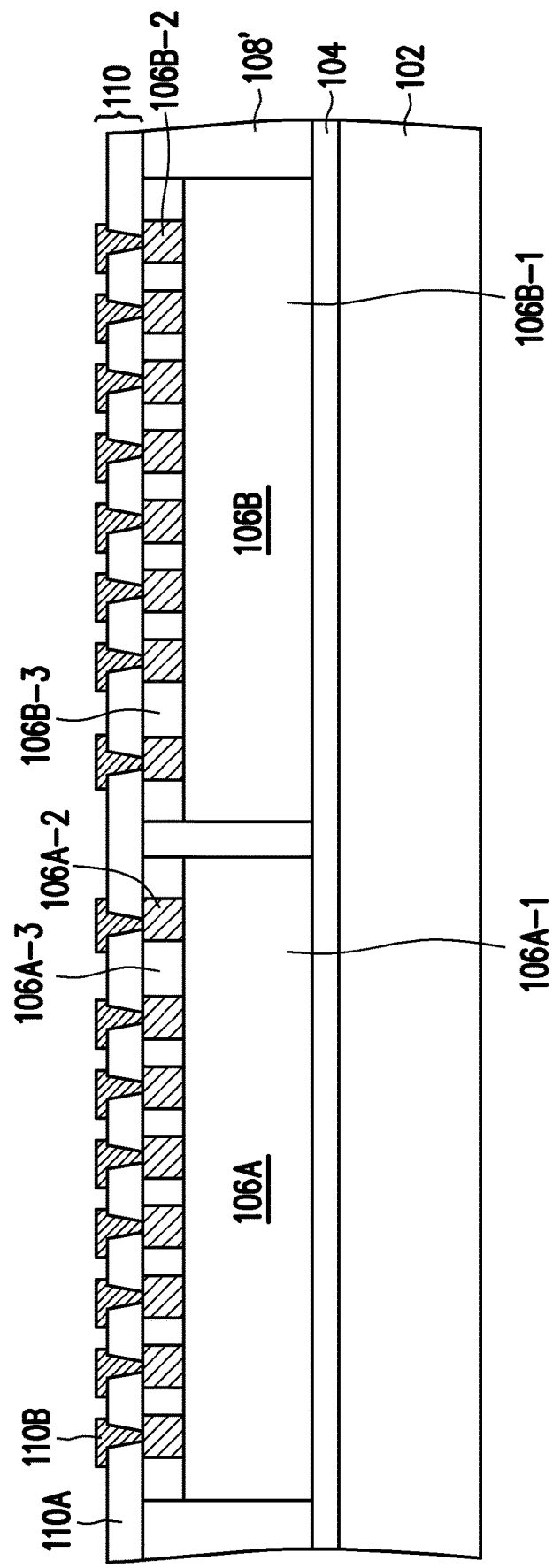

Referring to FIG. 1D, after the grinding/polishing step, a redistribution layer 110 is formed over the upper surface 108-US of the insulating encapsulation 108' and over the first die 106A and the second die 106B. For example, the formation of the redistribution layer 110 includes forming a patterned dielectric layer 110A and a patterned conductive layer 110B. In the exemplary embodiment, although the redistribution layer 110 is shown to include one patterned dielectric layer 110A and one patterned conductive layer 110B, but the disclosure is not limited thereto. In some alternative embodiments, a plurality of patterned dielectric layer 110A and a plurality of patterned conductive layer 110B may be formed in alternation to constitute the redistribution layer 110. In some embodiments, the patterned conductive layer 110B may be physically and electrically connected to the conductive pillars 106A-2 of the first die 106A and the conductive pillars 106B-2 of the second die 106B.

In some embodiments, the material of the patterned dielectric layer 110A may be polyimide, polybenzoxazole (PBO), benzocyclobutene (BCB), a nitride such as silicon nitride, an oxide such as silicon oxide, phosphosilicate glass (PSG), borosilicate glass (BSG), boron-doped phosphosilicate glass (BPSG), a combination thereof or the like, which may be patterned using a photolithography and/or etching process. In some embodiments, the material of the patterned dielectric layer 110A may be formed by suitable fabrication techniques such as spin-on coating, chemical vapor deposition (CVD), plasma-enhanced chemical vapor deposition (PECVD) or the like. The disclosure is not limited thereto.

In some embodiments, the material of the patterned conductive layer 110B may be made of conductive materials formed by electroplating or deposition, such as aluminum, titanium, copper, nickel, tungsten, and/or alloys thereof, which may be patterned using a photolithography and etching process. In some embodiments, the patterned conductive layer 110B may be patterned copper layers or other suitable patterned metal layers. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc.

Figure 1E:
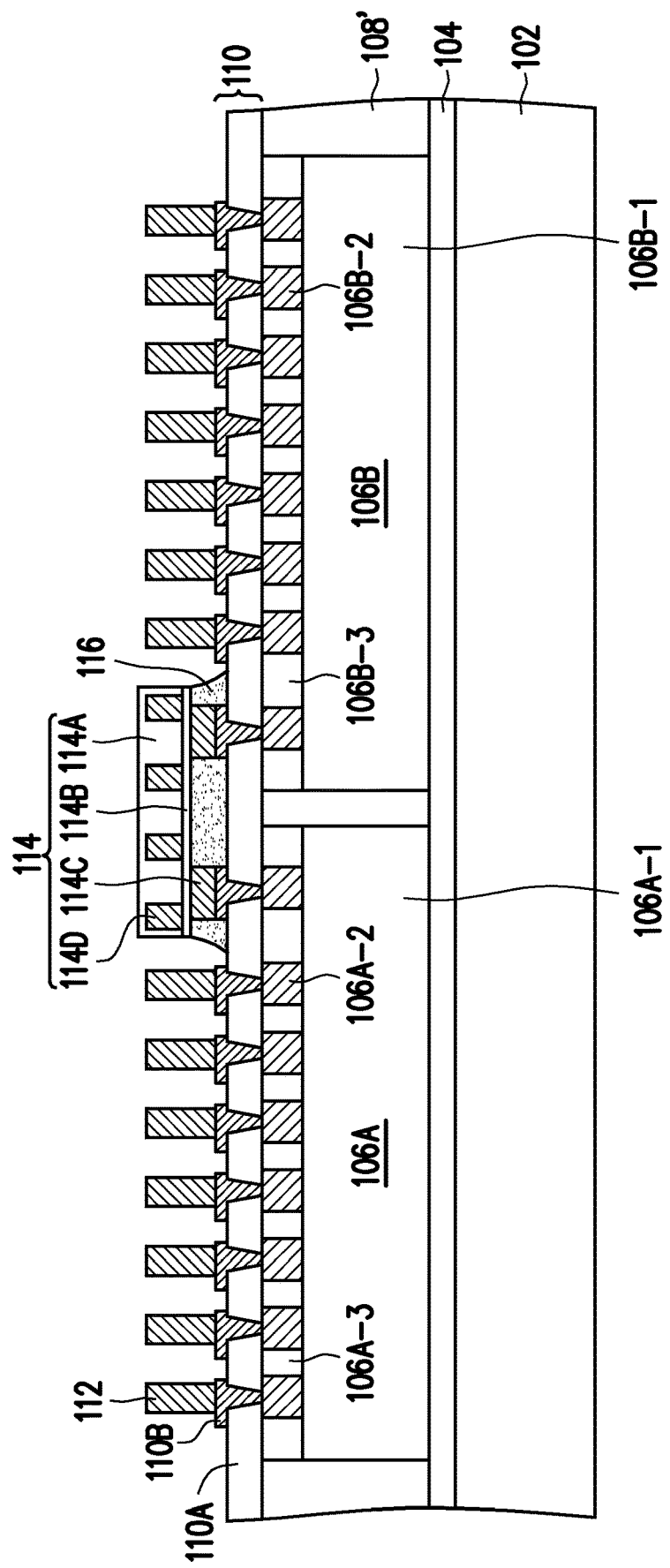

Referring to FIG. 1E, in a next step, after forming the redistribution layer 110, one or more conductive connectors 112 may be formed on the redistribution layer 110. A material of the conductive connectors 112 may include copper, nickel, solder, a combination thereof, or the like. In some embodiments, the method of forming the conductive connectors 112 includes the following steps. A photoresist layer with openings (not shown) is formed on the redistribution layer 110, and the openings of the photoresist layer may expose the intended locations of the patterned conductive layer 110B for the subsequently formed conductive connectors 112. Subsequently, a plating process or other suitable deposition process is performed to form a metallic layer (e.g., a copper-containing layer) in the openings of the photoresist layer, and then the photoresist layer is removed. The conductive connectors 112 are formed to remain on the patterned conductive layer 110B of the redistribution layer 110. In some embodiments, the conductive connectors 112 may be electrically coupled to the first die 106A and the second die 106B through the redistribution layer 110. It is appreciated that the number and the location of the conductive connectors 112 may be varied and modified based on design requirements.

As further illustrated in FIG. 1E, a third die 114 is disposed on the redistribution layer 110 aside the conductive connectors 112. In the exemplary embodiment, the third die 114 is picked and placed on the redistribution layer 110 after forming the conductive connectors 112. In some embodiments, the third die 114 is surrounded by the conductive connectors 112. In some embodiments, the third die 114 includes a semiconductor substrate 114A, a device layer 114B disposed on the semiconductor substrate 114A, and die connectors 114C connected to the device layer 114B. The device layer 114B may include a wide variety of IC devices (not shown; such as active devices (e.g., diodes, transistors, optoelectronic devices, etc.), and/or passive devices (e.g., resistors, capacitors, inductors, etc.)) formed on the semiconductor substrate 114A. The side where the die connectors 114C are distributed may be referred to as the front side of the third die 114. The third die 114 may be disposed in a flip-chip manner. For example, after disposing the third die 114, the front side of the third die 114 is connected to the patterned conductive layer 110B and faces toward the active surfaces (or top surfaces) of the first die 106A and the second die 106B. In some embodiments, the third die 114 includes through semiconductor vias 114D. The through semiconductor vias 114D penetrate through the semiconductor substrate 114A so as to be in electrical contact with the device layer 114B. In some embodiments, the third die 114 is a bridge structure (e.g., a silicon bridge) that provides a shorter electrical connection path between the first die 106A and the second dies 106B. For example, the third die 114 includes an interconnecting structure, and is free from active and/or passive device(s). The device layer 114B may be omitted when the third die 114 is provided to be used as the bridge structure. In alternative embodiments, the third die 114 includes an interconnecting structure, active devices, and optionally, passive devices.

Referring still to FIG. 1E, in some embodiments, an underfill 116 is optionally formed between the third die 114 and the redistribution layer 110. For example, a liquid organic material (e.g., epoxy mixture) is initially dispensed into a gap between the third die 114 and the redistribution layer 110, and then a curing process is performed to cure the liquid organic material so as to form the underfill 116. In some embodiments, the underfill 116 may cover the die connectors 114C of the third die 114 and the patterned conductive layer 110B of the redistribution layer 110, thereby strengthening the attachment and helping to prevent the thermal stresses from breaking the connection therebetween. In some embodiments, a portion of the underfill 116 travels up to cover the sidewalls of the third die 114. In other embodiments, the third die 114 is disposed on the redistribution layer 110 prior to the step of forming the conductive connectors 112.

Figure 1F:
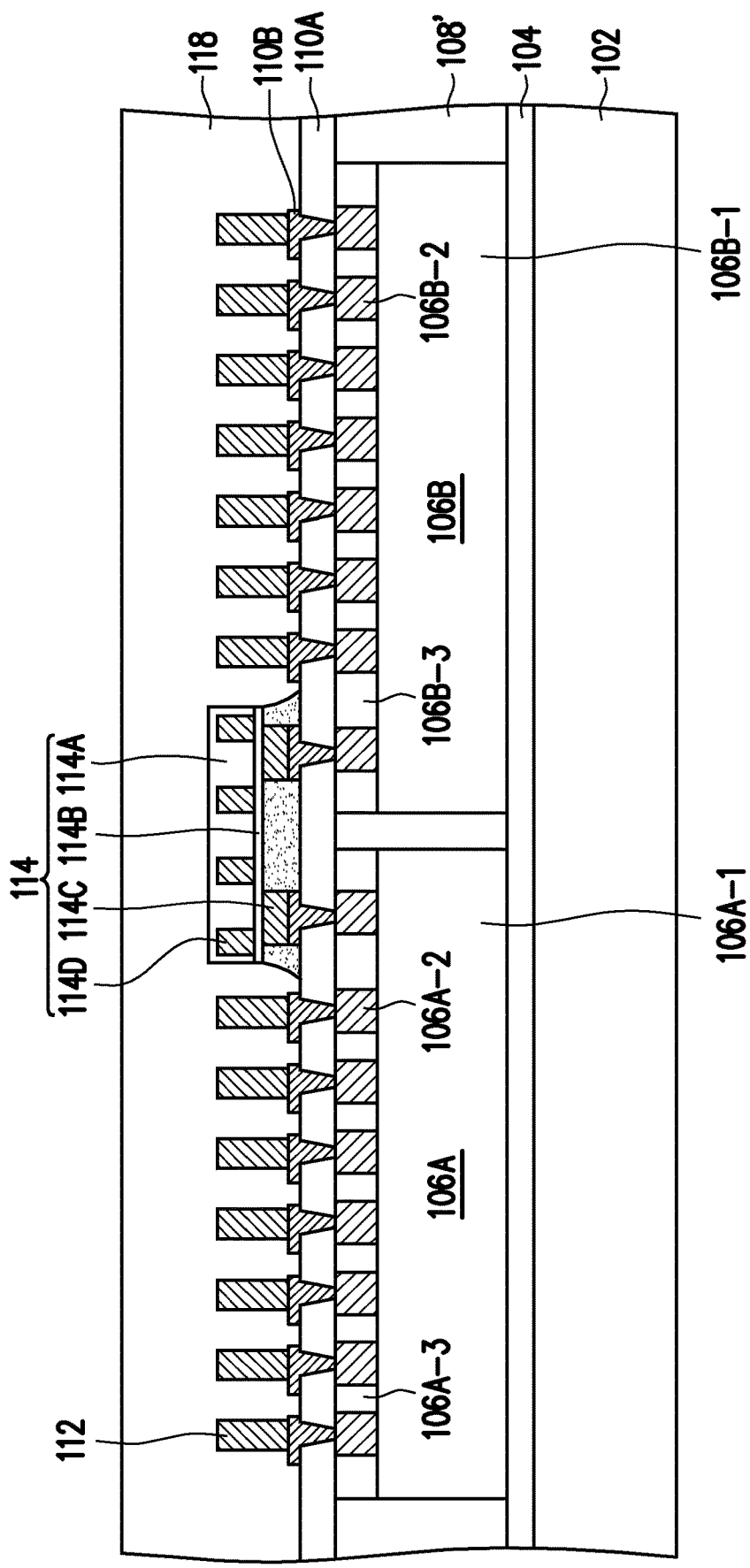

Referring to FIG. 1F, an insulating material 118 is formed on the redistribution layer 110 to encapsulate the conductive connectors 112, the third die 114 and the underfill 116. The insulating material 118 may be formed through, for example, a compression molding process, filling up the gaps between the third die 114 and the conductive connectors 112. In some embodiments, the insulating material 118 also fill up the gaps between adjacent conductive connectors 112. At this stage, the conductive connectors 112 and the through semiconductor vias 114D of the third die 114 are encapsulated by and well protected by the insulating material 118. In other words, the conductive connectors 112 and the through semiconductor vias 114D are not revealed by the insulating material 118. In some embodiments, a material of the insulating material 118 may be similar to that of insulating material 108, thus, its detailed description will be omitted herein. It is appreciated that the insulating material 118 and the insulating material 108 may be formed of the same material or different materials.

Figure 1G:
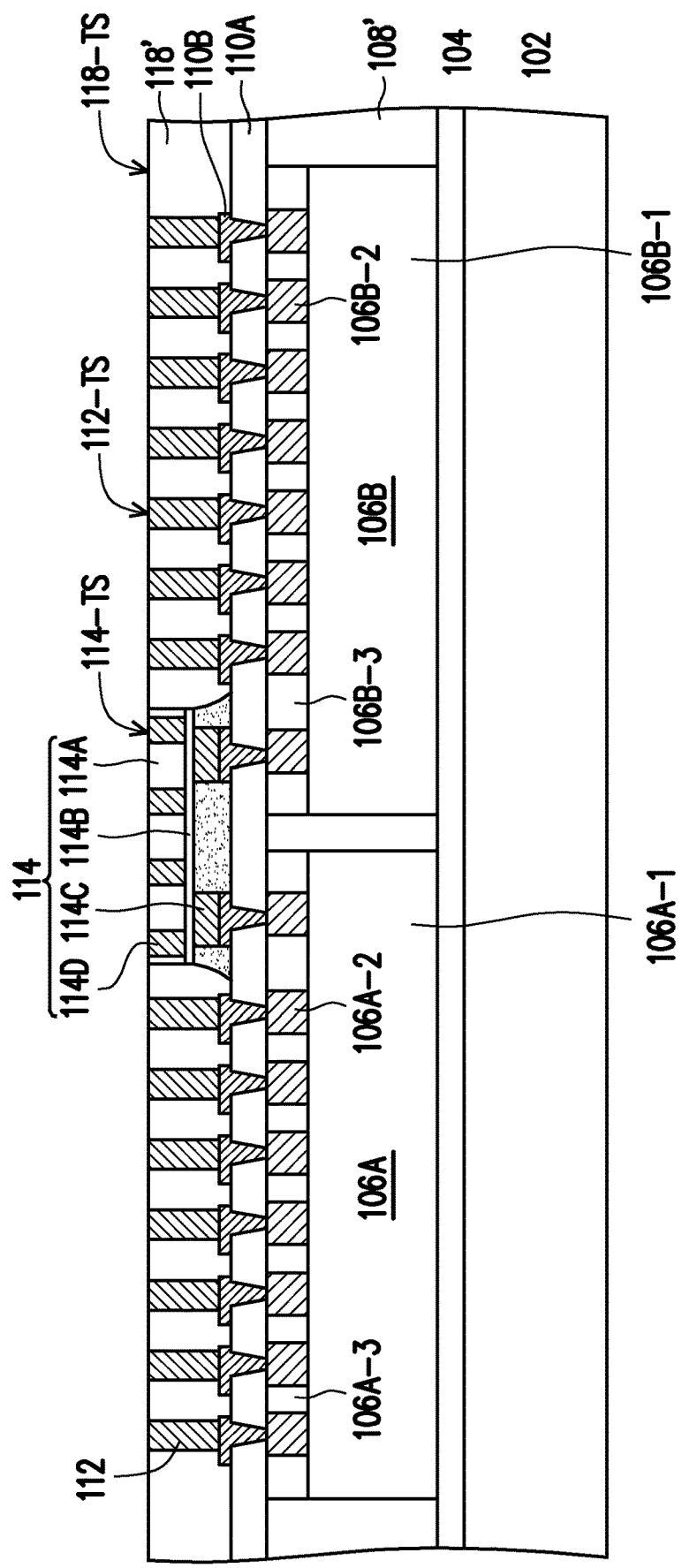

Referring to FIG. 1G, in some embodiments, the insulating material 118 is partially removed to reveal the conductive connectors 112 and the through semiconductor vias 114D of the third die 114. In some embodiments, the insulating material 118 is ground or polished by a planarization step. For example, the planarization step is performed through a mechanical grinding process and/or a chemical mechanical polishing (CMP) process until a top surface 112-TS of the conductive connectors 112 and a top surface 114-TS of the through semiconductor vias 114D are revealed. In some embodiments, the conductive connectors 112 and the through semiconductor vias 114D may also be slightly grinded/polished.

Furthermore, in the illustrated embodiment, the insulating material 118 is polished to form an insulating encapsulation 118'. In some embodiments, an upper surface 118-TS of the insulating encapsulation 118', the top surface 112-TS of the conductive connectors 112 and the top surface 114-TS of the through semiconductor vias 114D are coplanar and levelled with one another. In some embodiments, after the mechanical grinding or chemical mechanical polishing (CMP) steps, a cleaning step may be optionally performed. For example, the cleaning step is preformed to clean and remove the residue generated from the planarization step. However, the disclosure is not limited thereto, and the planarization step may be performed through any other suitable methods.

Figure 1H:
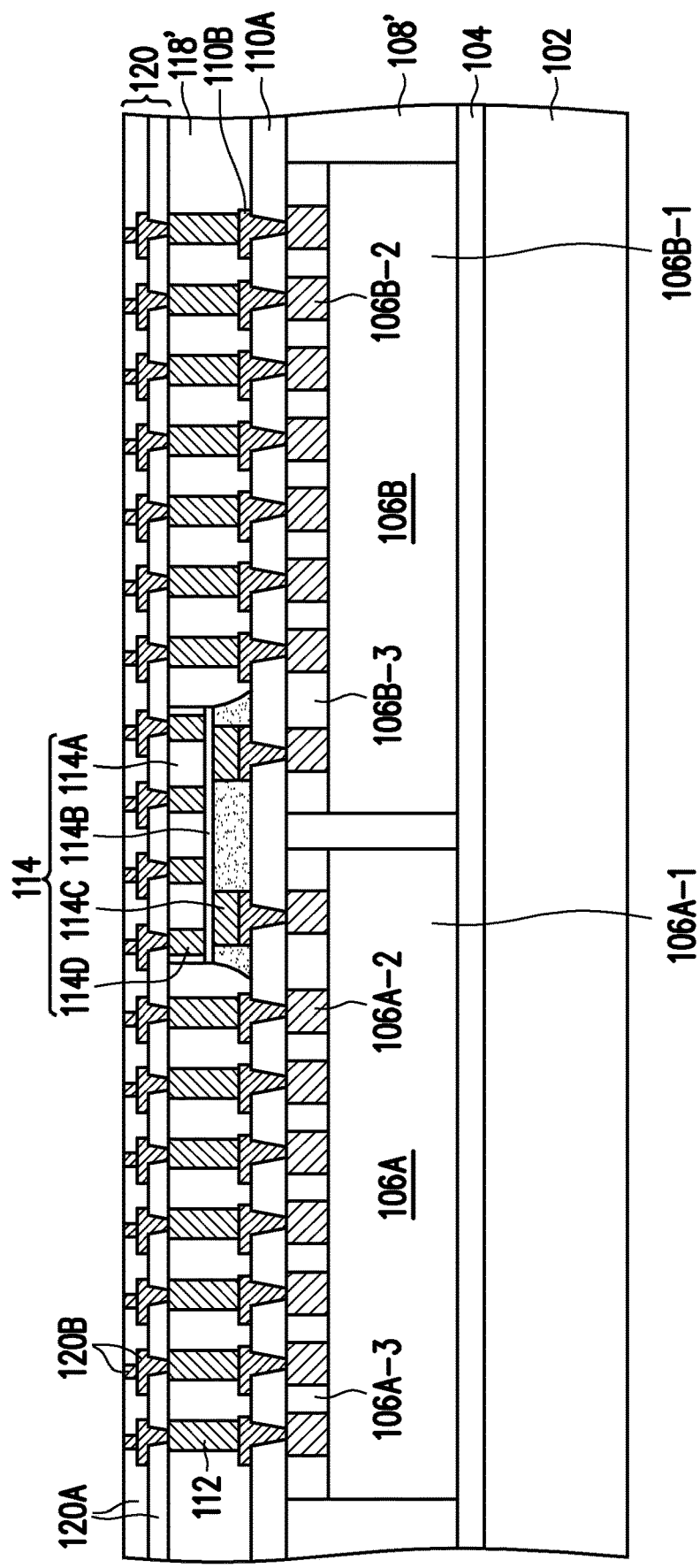

Referring to FIG. 1H, after the grinding/polishing step, a redistribution layer 120 is formed over the upper surface 118-TS of the insulating encapsulation 118'. For example, the formation of the redistribution layer 120 includes forming a plurality of patterned dielectric layer 120A and a plurality of patterned conductive layer 120B stacked alternately. It is appreciated that the number of patterned dielectric layer 120A and patterned conductive layer 120B is not limited in the disclosure, and may be appropriately adjusted based on design requirements. Furthermore, materials of the patterned dielectric layer 120A and patterned conductive layer 120B may be similar to the patterned dielectric layer 110A and patterned conductive layer 110B described previously. Therefore, the details of the patterned dielectric layer 120A and patterned conductive layer 120B will be omitted herein. In the exemplary embodiment, the patterned conductive layer 120B is physically and electrically connected to the conductive connectors 112 and the through semiconductor vias 114D of the third die 114. In certain embodiments, the redistribution layer 120 may be electrically connected to the first die 106A and the second die 106B through the redistribution layer 110.

Figure 1I:
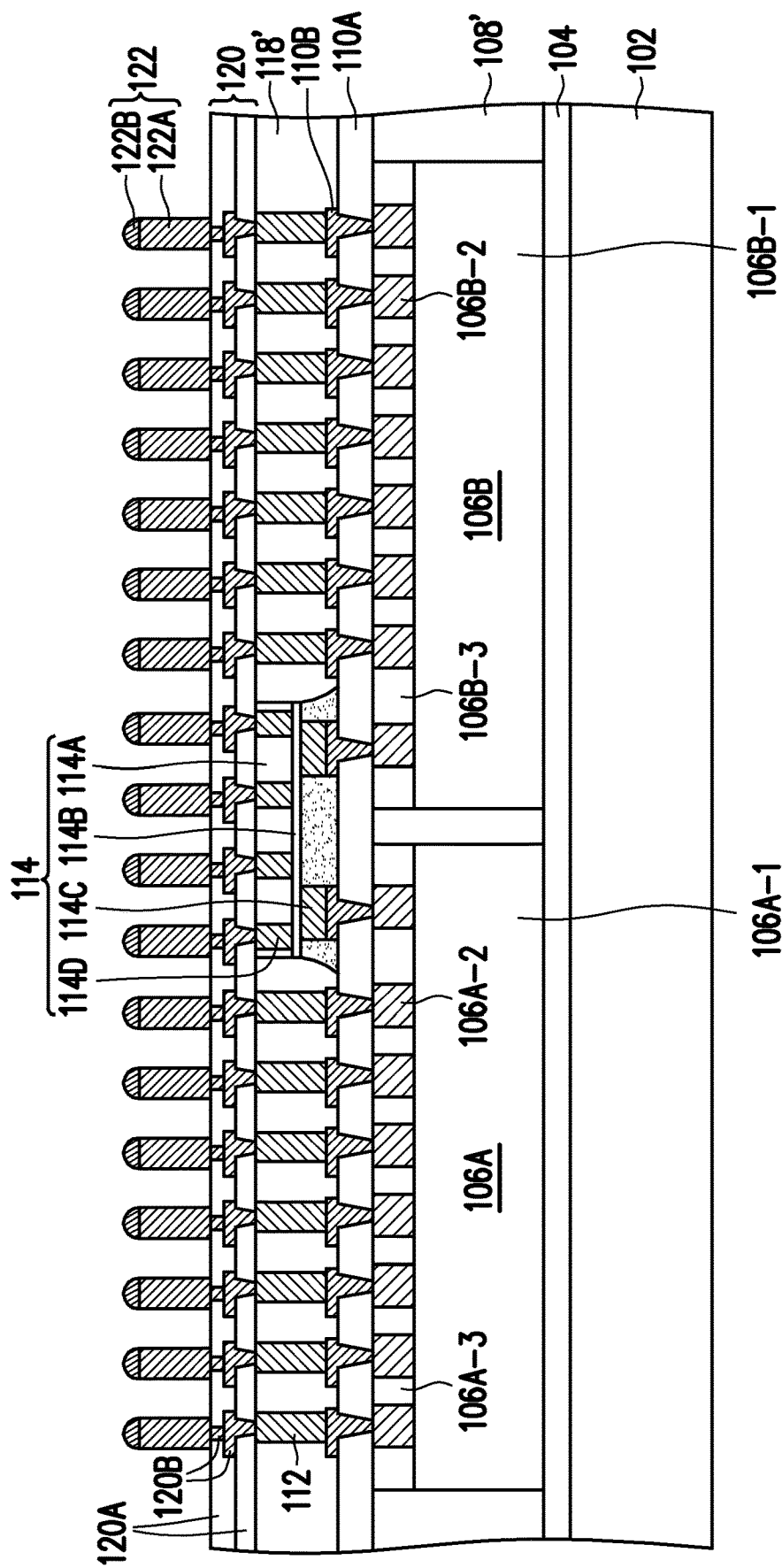

Referring to FIG. 1I, after forming the redistribution layer 120, a plurality of conductive terminals 122 may be formed on the redistribution layer 120. In some embodiments, each of the conductive terminals 122 may include a first portion 122A and a second portion 122B. The first portion 122A is formed on and electrically connected to the patterned conductive layer 120B of the redistribution layer 120, and the second portion 122B is formed on the first portion 122A. In some embodiments, the first portion 122A and the second portion 122B are made of different materials. For example, the first portion 122A is substantially a conductive material layer including pure elemental copper, copper containing unavoidable impurities, or copper alloys containing minor amounts of elements such as tantalum, indium, tin, zinc, titanium, germanium, platinum, aluminum, etc. The second portion 122B may include solder material including alloys of tin, lead, silver, copper, nickel, bismuth, or combinations thereof. In some embodiments, the conductive terminals 122 includes a plurality of bumps arranged in an array.

In some embodiments, the method of forming the conductive terminals 122 includes at least the following steps. A mask layer (not shown) having a plurality of openings is initially formed on the patterned dielectric layer 120A of the redistribution layer 120. The openings of the mask layer may expose the intended locations of the patterned conductive layer 120B of the redistribution structure 120 for the subsequently formed conductive terminals 122. Next, a plating process or other suitable deposition process may be performed in the openings of the mask layer to form the first portions 122A being in physical and electrical contact with the patterned conductive layer 120B. Subsequently, a solder material may be formed in the openings of the mask layer to form the second portions 122B being in physical and electrical contact with respective ones of the underlying first portions 122A using suitable methods (e.g., evaporation, electroplating, printing, solder transfer, ball placement, etc.). Thereafter, the mask layer is removed, and the conductive terminals 122 are remained on the patterned conductive layer 120B of the redistribution structure 120. In some embodiments, the array of the conductive terminals 122 is formed in a fine-pitched arrangement so as to enable high-density electrical connection.

Figure 1J:
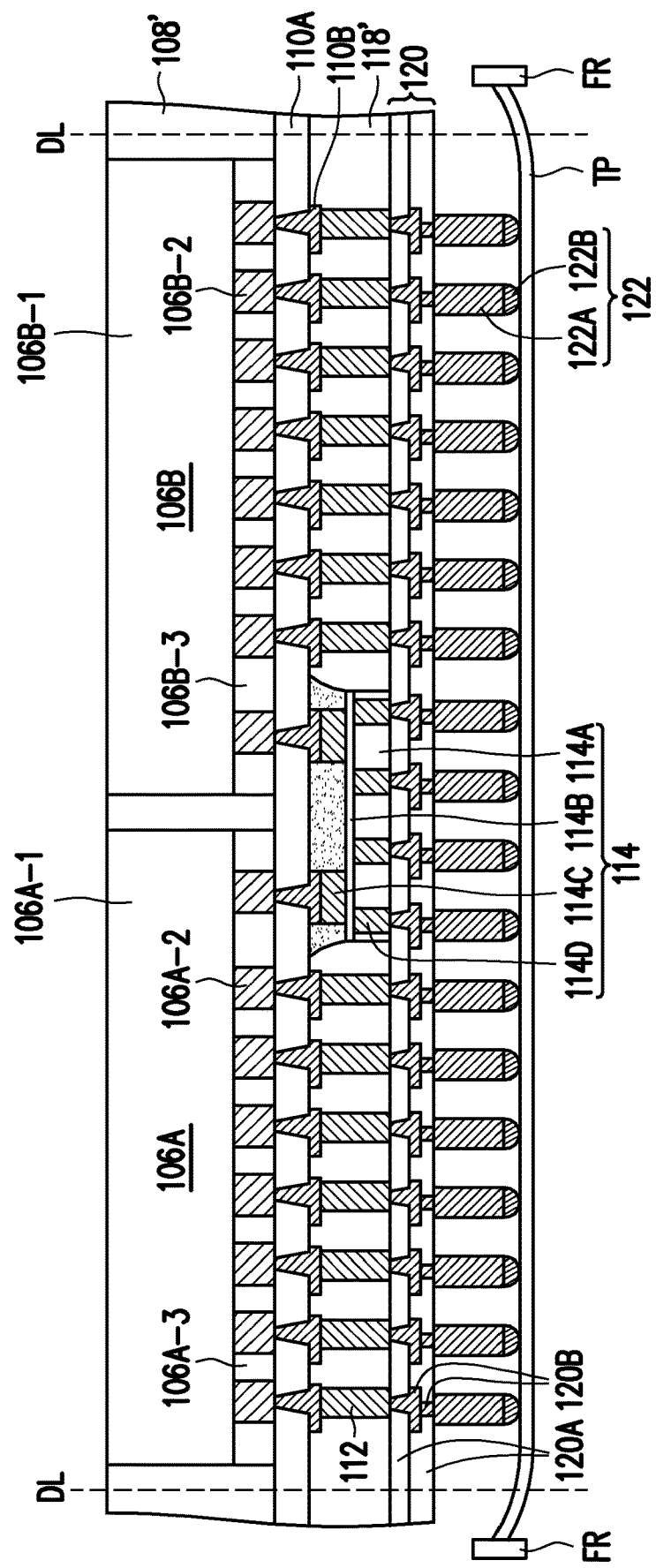

Referring to FIG. 1J, after forming the conductive terminals 122 on the redistribution structure 120, the structure shown in FIG. 1I may be turned upside down and attached to a tape TP (e.g., a dicing tape) supported by a frame FR. Thereafter, the carrier 102 may be debonded and separated from the components located thereon. In some embodiments, the de-bonding process includes projecting a light such as a laser light or an UV light on the debond layer 104 (e.g., the LTHC release layer) so that the carrier 102 can be easily removed along with the debond layer 104. During the de-bonding step, the tape TP is used to secure the device structure before de-bonding the carrier 102 and the debond layer 104. After the de-bonding process, backside surfaces of the insulating encapsulation 108' may be revealed or exposed.

Figure 1K:
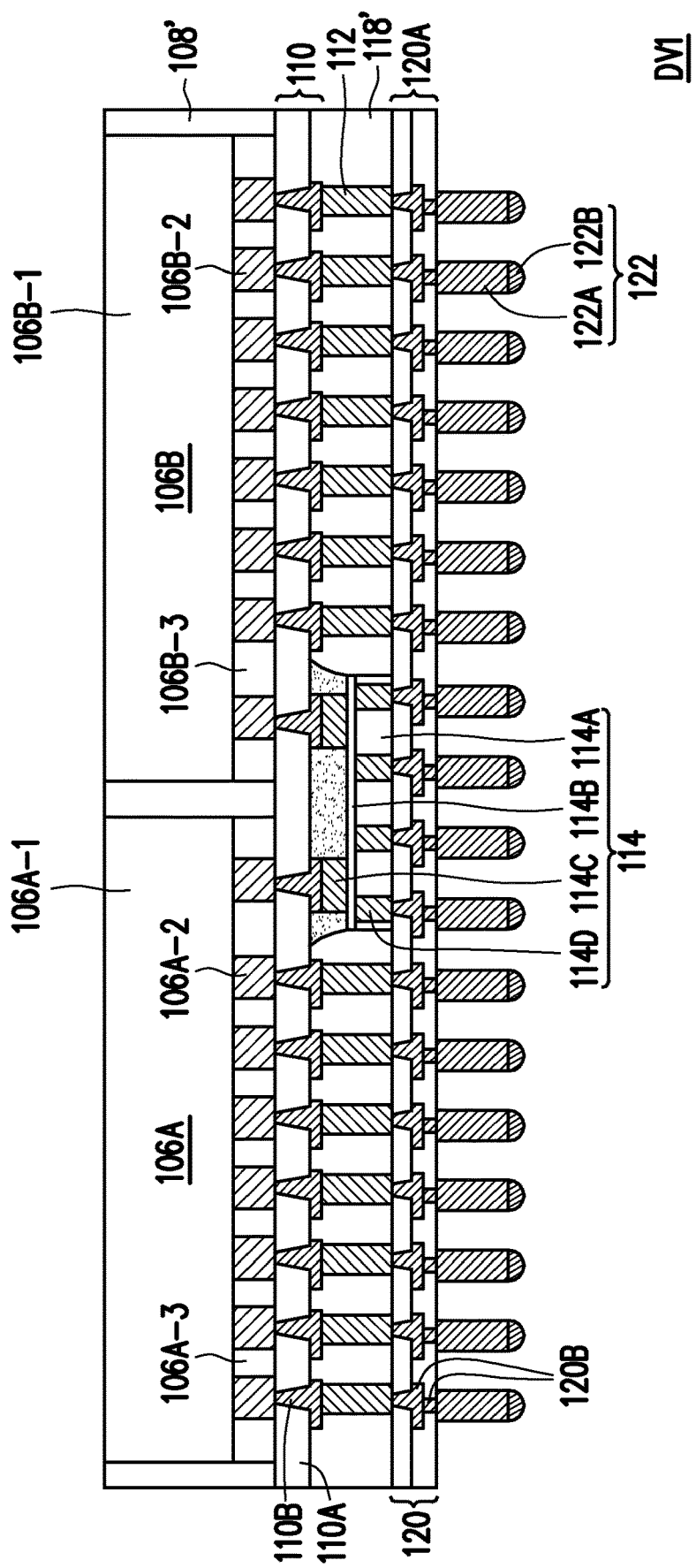

Referring to FIG. 1K, after the de-bonding process, a dicing process is performed along the dicing lines DL (shown in FIG. 1J) to cut the whole wafer structure (cutting through the insulating encapsulations 108', 118' and through the redistribution layers 110, 120) into a plurality of devices DV1. In the exemplary embodiment, the dicing process is a wafer dicing process including mechanical blade sawing or laser cutting. In a subsequent process, the separated devices DV1 may be further disposed on other components and be electrically connected to other components based on requirements.

Figure 2A:
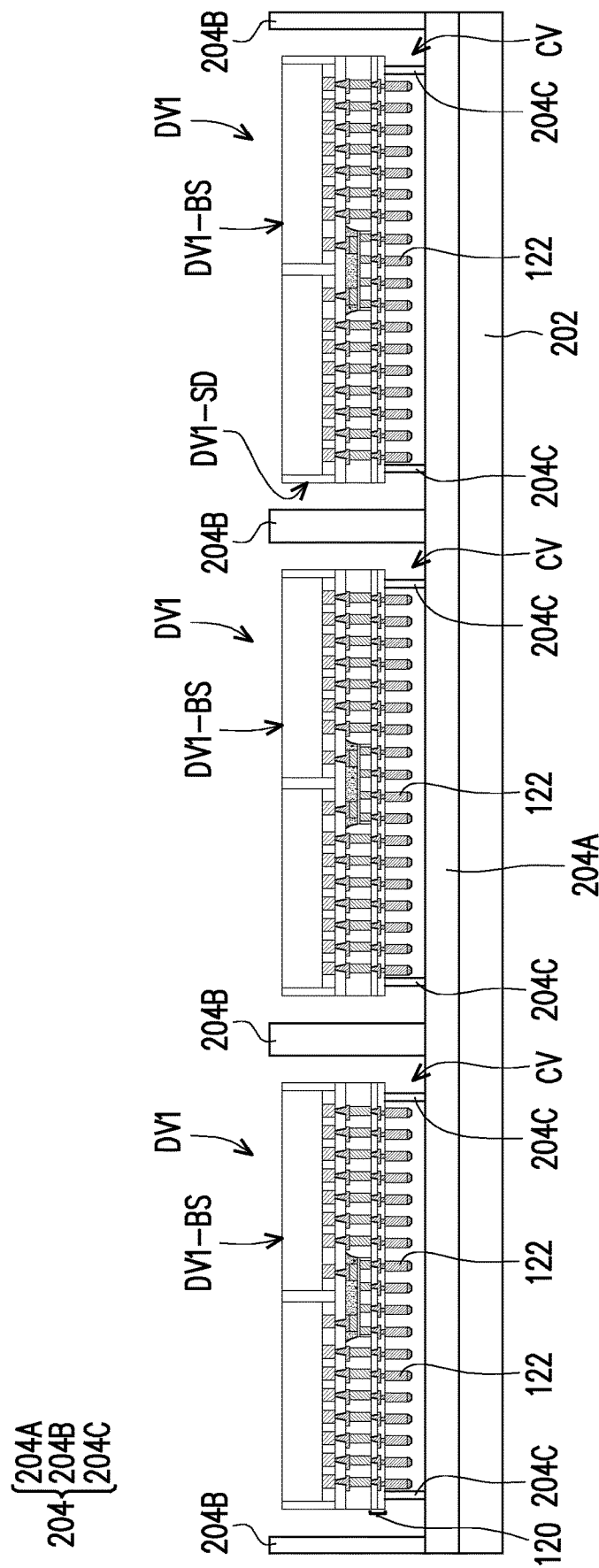
FIG. 2A to FIG. 2F are schematic sectional views of various stages in a method of fabricating a package structure according to some exemplary embodiments of the present disclosure.

FIG. 2A to FIG. 2F are schematic sectional views of various stages in a method of fabricating a package structure according to some exemplary embodiments of the present disclosure. Referring to FIG. 2A, the devices DV1 obtained in FIG. 1K may be placed in the cavities CV of a tray 204. In some embodiments, the tray 204 is supported by a carrier 202. For example, the carrier 202 may be any type of carrier that is suitable for supporting the components located thereon. In some embodiments, the tray 204 includes a base portion 204A, partition walls 204B and support walls 204C.

As illustrated in FIG. 2A, the partition walls 204B and the support walls 204C are located on the base portion 204A. In some embodiments, the partition walls 204B define the cavities CV of the tray 204. In some embodiments, the support walls 204C support the devices DV1 in the cavities CV of the tray 204. In certain embodiments, the conductive terminals 122 of the devices DV1 are surrounded by the support walls 204C of the tray 204 when the devices DV1 are placed in the cavities CV of the tray 204. Furthermore, a height of the support walls 204C may be lower than a height of the partition walls 204B.

As further illustrated in FIG. 2A, the devices DV1 are disposed in the cavities CV of the tray 204 in a flip-chip manner. For example, the conductive terminals 122 is facing the base portion 204A, while the backside surface DV1-BS of the devices DV1 faces away from the base portion 204A. In some embodiments, the support walls 204C is in contact with the redistribution layer 120 of the devices DV1 to provide support to the devices DV1. In some embodiments, the partition walls 204B surrounds the side surfaces DV1-SD of the devices DV1, and further surrounds the support walls 204C.

Figure 2B:
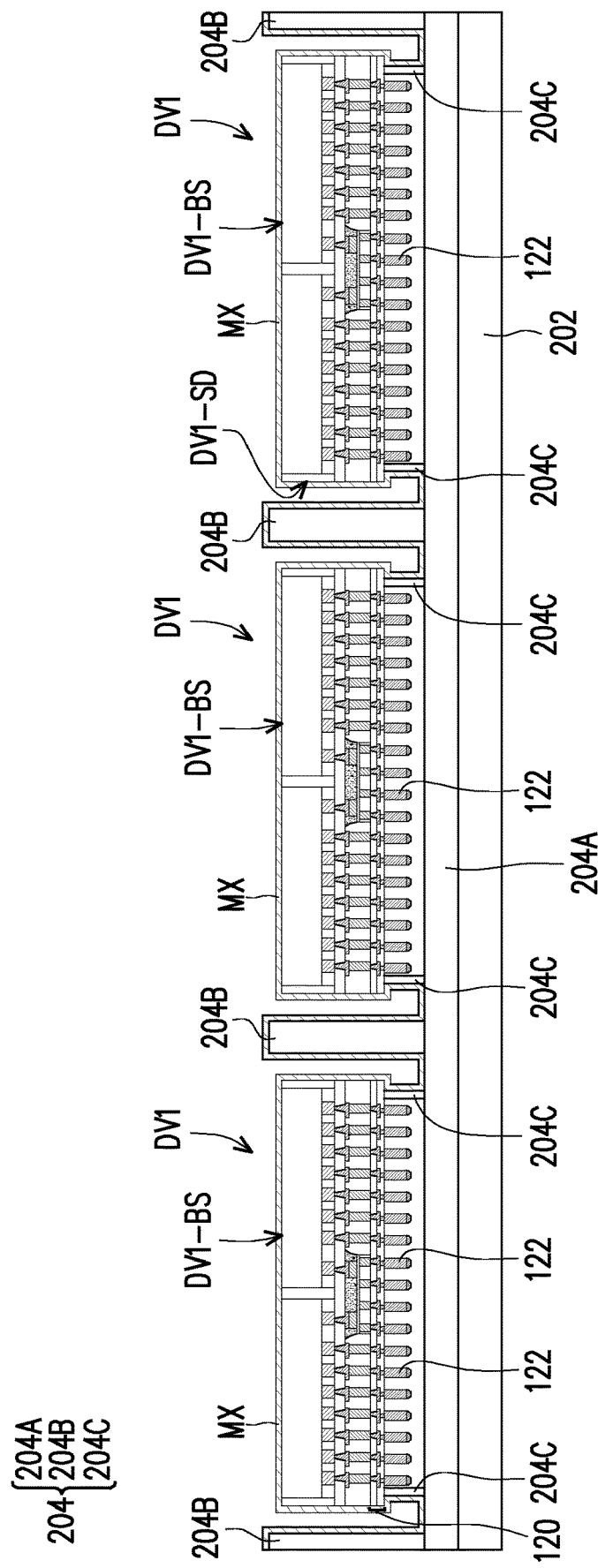

Referring to FIG. 2B, after placing the devices DV1 in the tray 204, a metallic material layer MX may be formed to cover the devices DV1 and the tray 204. In the exemplary embodiment, the metallic material layer MX is formed conformally over the partition walls 204B, the base portion 204A, the support walls 204C and over the devices DV1. For example, the metallic material layer MX covers at least the backside surface DV1-BS and the side surfaces DV1-SD of the devices DV1, and cover portions of the tray 204. In some embodiments, the metallic material layer MX may be formed over the devices DV1 and the tray 204 through sputtering, printing, plating or the like. The disclosure is not limited thereto. In certain embodiments, the metallic material layer MX may include materials such as aluminum (Al), titanium (Ti), titanium nitride (TiN), nickel (Ni), nickel-vanadium (NiV), gold (Au), silver (Ag), stainless steel (SUS), copper (Cu) or the like.

Figure 2C:
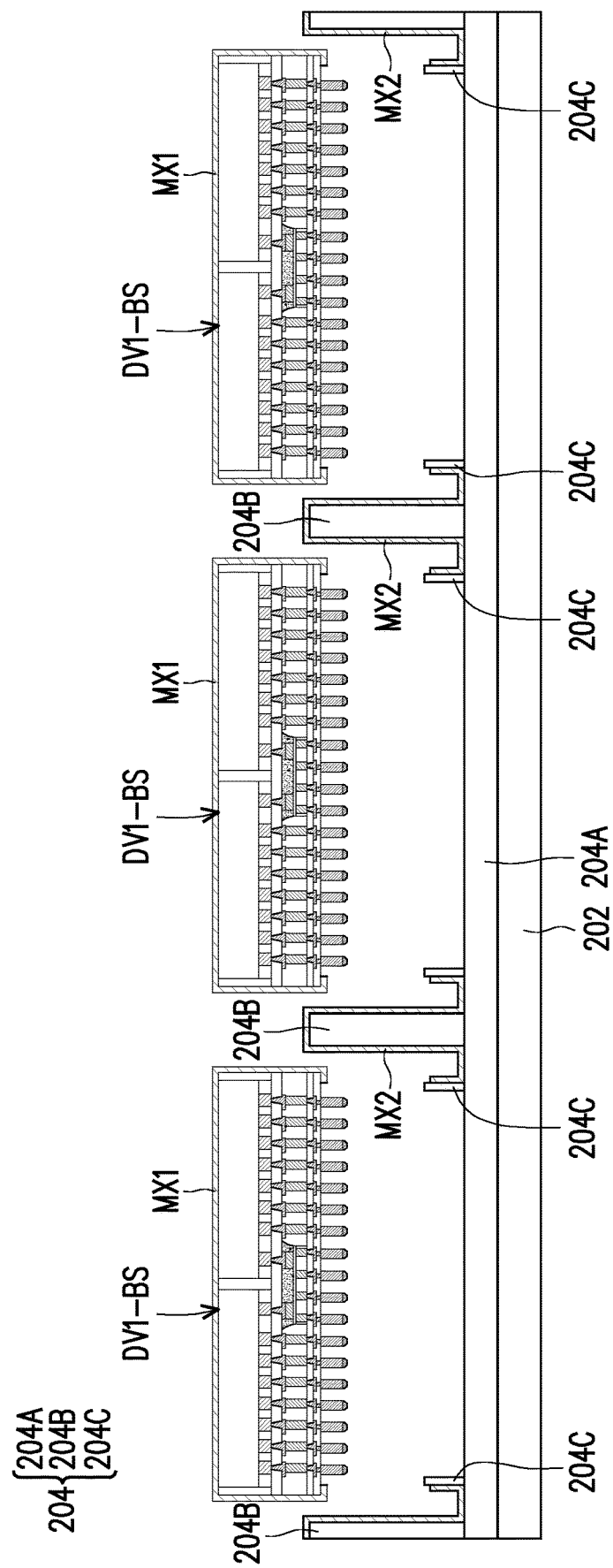

Referring to FIG. 2C, in a next step, after forming the metallic material layer MX, the devices DV1 covered by the metallic material layer MX may be picked up or removed from the tray 204. For example, the devices DV1 are picked up so that the metal layer MX1 of the metallic material layer MX is separated from a residue portion MX2 of the metallic material layer MX. In some embodiments, metal layer MX1 is remained on the devices DV1 and covers at least the backside surface DV1-BS of the devices DV1. In certain embodiments, the residue portion MX2 cover portions of the tray 204. For example, the residue portion MX2 covers sidewalls of the partition walls 204B and the support walls 204C, covers part of the base portion 204A, and reveals another part of the base portion 204A. In some embodiments, after removing the devices DV1 from the tray 204, the residue portion MX2 may be removed from the tray 204 for further processing.

Figure 2D:
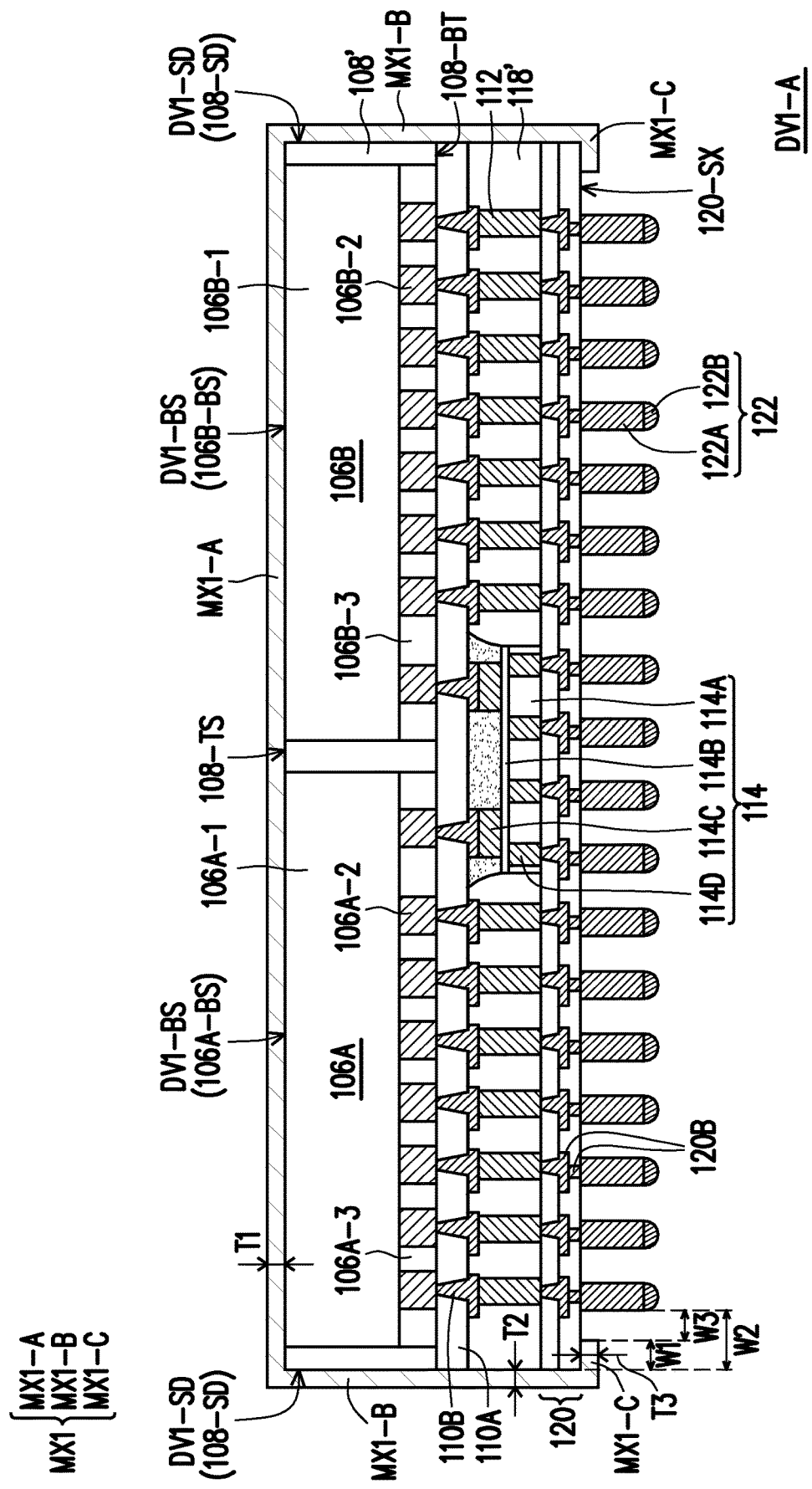

As illustrated in FIG. 2D, after picking up the devices DV1 from the tray 204, the obtained metal-coated device DV1-A includes the metal layer MX1 covered on the device DV1. In the exemplary embodiment, the metal layer MX1 covers a top surface 108-TS of the insulating encapsulation 108'. In some embodiments, the top surface 108-TS of the insulating encapsulation 108' is substantially leveled with the back surface 106A-BS of the first die 106A and leveled with the back surface 106B-BS of the second die 106B. In certain embodiments, the metal layer MX1 may include a first portion MX1-A, second portions MX1-B and third portions MX1-C. For example, the first portion MX1-A covers the top surface 108-TS of the insulating encapsulation 108', and covers the backside surface DV1-BS of the devices DV1. The second portions MX1-B covers side surfaces 108-SD of the insulating encapsulation 108' and covers the side surfaces DV1-SD of the devices DV1. The third portions MX1-C partially covers a bottom surface 108-BT of the insulating encapsulation 108', whereby the bottom surface 108-BT is opposite to the top surface 108-TS.

As further illustrated in FIG. 2D, the first portion MX1-A may have a thickness of T1, the second portion Mx1-B may have a thickness of T2 and the third portion MX1-C may have a thickness of T3. In some embodiments, the thickness T2 may be smaller than or equal to the thickness T1. For example, a ratio of the thicknesses T2:T1 may be in a range of 0.3:1 to 1:1. In some embodiments, the thickness T3 may be smaller than or equal to the thickness T2. For example, a ratio of the thicknesses T3:T2 may be in a range of 0.3:1 to 1:1. In certain embodiments, the thickness T3 is smaller than the thickness T1. For example, a ratio of the thicknesses T3:T1 may be in a range of 0.1:1 to 0.3:1. The thicknesses of the first portion MX1-A, the second portion Mx1-B and the third portion MX1-C are controlled to prevent delamination at the backside of the devices DV1 and to improve heat dissipation. In some embodiments, a width W1 of the third portions MX1-C may be smaller than a distance W2 between the conductive terminals 122 and an edge of the devices DV1. In other words, the third portions MX1-C are spaced apart from the conductive terminals 122 of the devices DV1. In certain embodiments, the third portions MX1-C are spaced apart from the nearest conductive terminal 122 by distance W3. In some embodiments, the distance W3 may be smaller than or greater than the distance W2. In some alternative embodiments, the distance W3 may be equal to distance W2, the disclosure is not limited thereto.

Figure 2E:
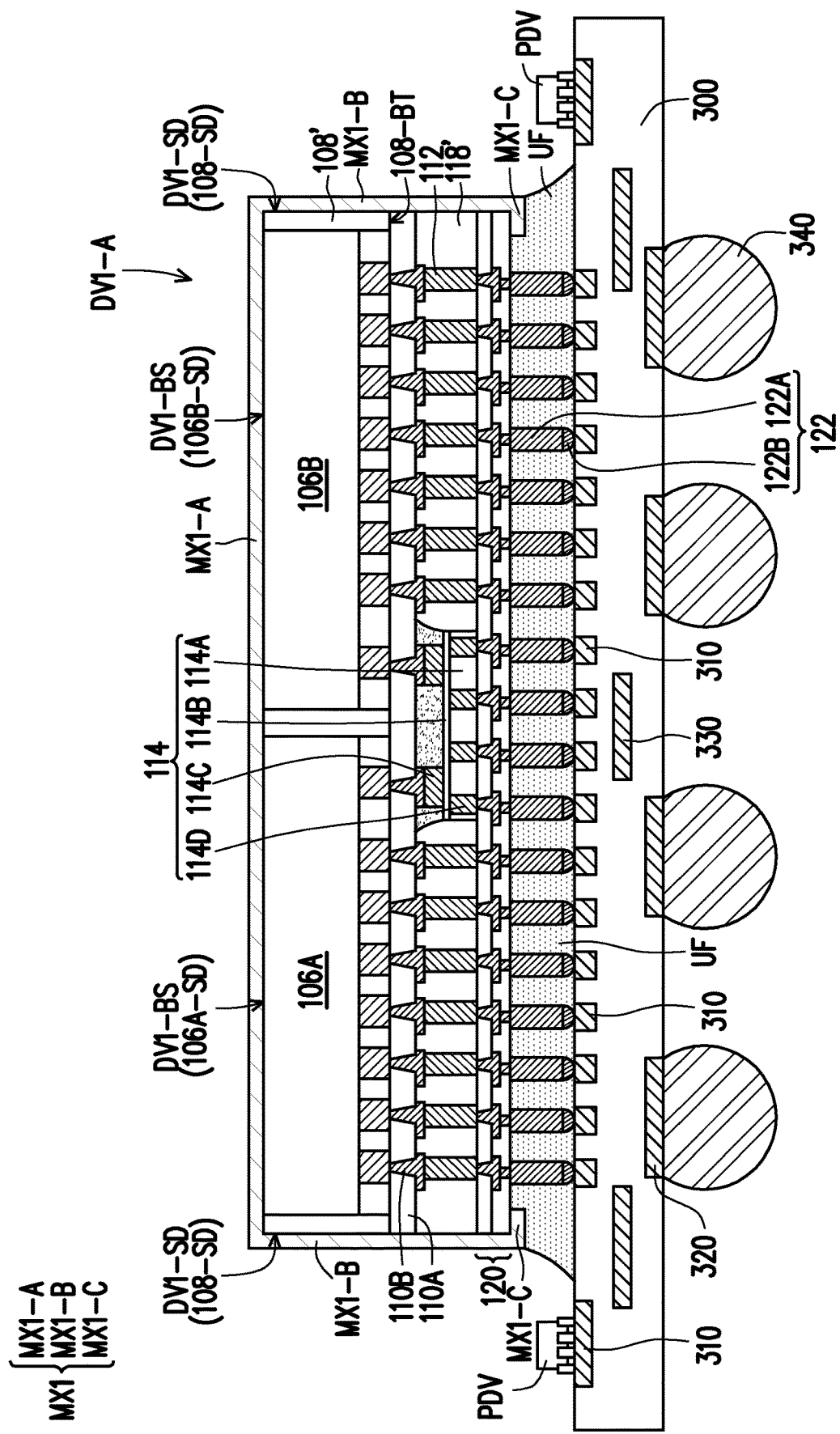

Referring to FIG. 2E, after obtaining the metal-coated device DV1-A (device DV1 covered by metal layer MX1), the device DV1-A is mounted or attached onto a circuit substrate 300 through the conductive terminals 122. In some embodiments, the circuit substrate 300 include contact pads 310, contact pads 320, metallization layers 330, and vias (not shown). In some embodiments, the contact pads 310 and the contact pads 320 are respectively distributed on two opposite sides of the circuit substrate 300, and are exposed for electrically connecting with later-formed elements/features. In some embodiments, the metallization layers 330 and the vias are embedded in the circuit substrate 300 and together provide routing function for the circuit substrate 300, wherein the metallization layers 330 and the vias are electrically connected to the contact pads 310 and the contact pads 320. In other words, at least some of the contact pads 310 are electrically connected to some of the contact pads 320 through the metallization layers 330 and the vias. In some embodiments, the contact pads 310 and the contact pads 320 may include metal pads or metal alloy pads. In some embodiments, the materials of the metallization layers 330 and the vias may be substantially the same or similar to the material of the contact pads 310 and the contact pads 320.

In some embodiments, the device DV1-A is bonded to the circuit substrate 300 through physically connecting the conductive terminals 122 and the contact pads 310 to form a stacked structure. In certain embodiments, the device DV1-A is physically and electrically connected to the circuit substrate 300. In some embodiments, the circuit substrate 300 is such as an organic flexible substrate or a printed circuit board. In such embodiments, the conductive terminals 122 are, for example, chip connectors. In some embodiments, a plurality of conductive balls 340 are respectively formed on the substrate 300. As shown in FIG. 2E, for example, the conductive balls 340 are connected to the contact pads 320 of the circuit substrate 300. In other words, the conductive balls 340 are electrically connected to the circuit substrate 300 through the contact pads 320. Through the contact pads 310 and the contact pads 320, some of the conductive balls 340 are electrically connected to the device DV1-A (e.g. connected to the first die 106A and the second die 106B included therein). In some embodiments, the conductive balls 340 are, for example, solder balls or ball grid array (BGA) balls. In addition, as illustrated in FIG. 2E, one or more passive components PDV (integrated passive device or surface mount devices) may be mounted on the circuit substrate 300. For example, the passive components PDV may be mounted on the contact pads 310 of the circuit substrate 300 through a soldering process. The disclosure is not limited thereto.

As further illustrated in FIG. 2E, an underfill UF is formed between the device DV1-A and the circuit substrate 300 to encapsulate conductive terminals 122 of the device DV1-A. In some embodiments, the underfill UF fills up the spaces in between adjacent conductive terminals 122 and covers the conductive terminals 122. In some embodiments, the underfill UF may be in contact with the third portion MX1-C of the metal layer MX1. In some alternative embodiments, the underfill UF may be in contact with the third portion MX1-C and the second portion Mx1-B of the metal layer MX1. In other words, the underfill UF may also partially cover the sidewalls of the device DV1-A. In some embodiments, the passive components PDV are exposed by the underfill UF, and kept a distance apart from the underfill UF. In other words, the underfill UF does not cover or contact the passive components PDV.

Figure 2F:
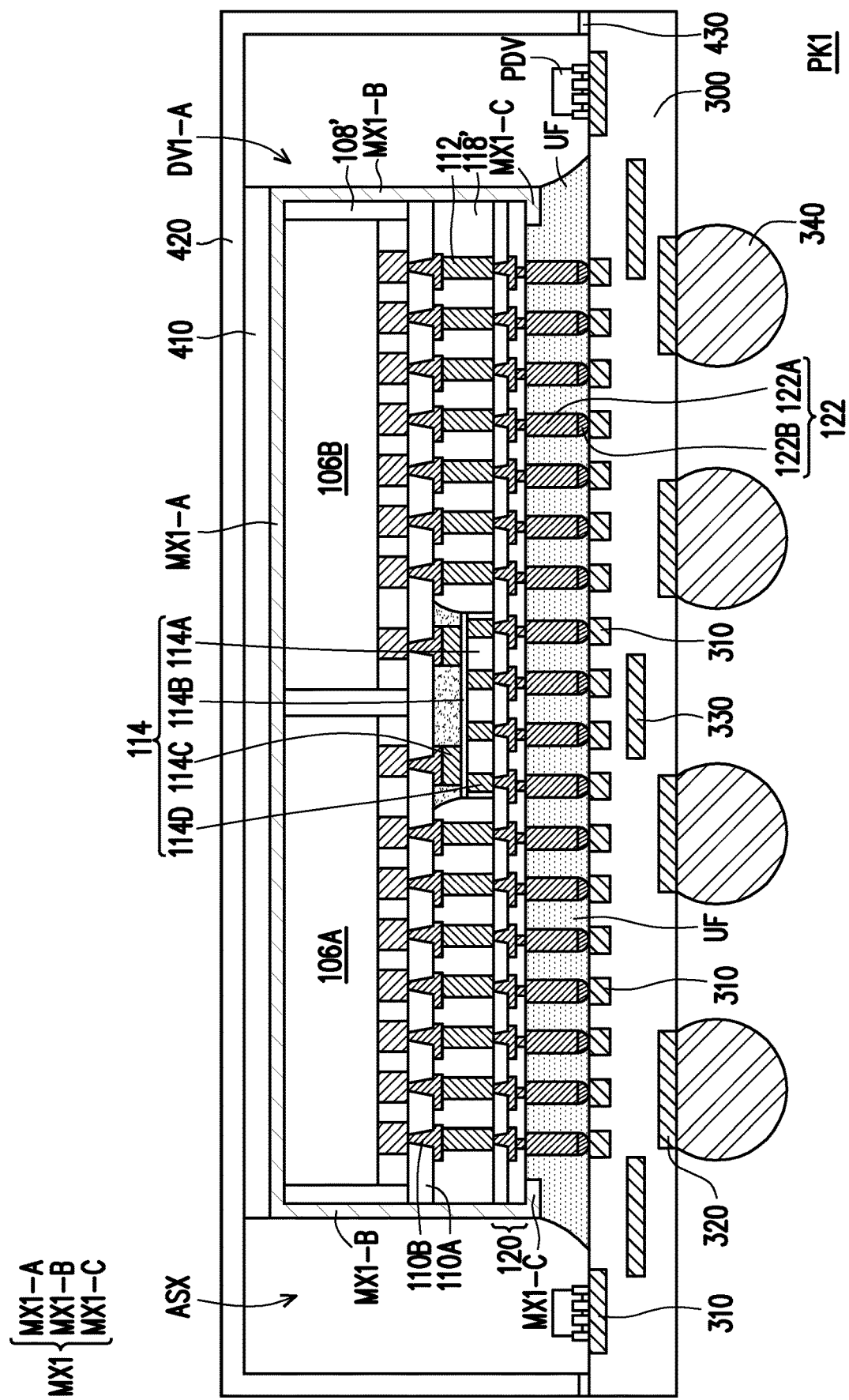

Referring to FIG. 2F, a lid 420 is mounted on the circuit substrate 300. In some embodiments, before mounting the lid 420 on the circuit substrate 300, a thermal interface material layer 410 is mounted on the metal layer MX1 (part of the metallic material layer MX). In the exemplary embodiment, the lid 420 is adhered to the metal layer MX1 (part of the metallic material layer MX) on the device DV1-A through the thermal interface material layer 410. In other words, the thermal interface material layer 410 is sandwiched between the lid 420 and the metal layer MX1 (e.g. first portion MX1-A of metal layer MX1) and is in physical contact with the lid 420 and the metal layer MX1. In some embodiments, sidewalls of the thermal interface material layer 410 is aligned with sidewalls of the metal layer MX1.

In some embodiments, the lid 420 is attached to the circuit substrate 300 through an adhesive material 430. For example, the adhesive material 430 may be a conductive adhesive, but the disclosure is not limited thereto. In alternative embodiments, the adhesive material 430 may be any other suitable adhesive materials as long as the attachment of the lid 420 onto the circuit substrate 300 can be achieved. In some embodiments, the lid 420 is covering the thermal interface material layer 410, the passive components PDV, the metal layer MX1 and the device DV1 (or device DV1-A). In other words, an accommodating spacing ASX is defined by the lid 420 and the circuit substrate 300, whereas the thermal interface material layer 410, the passive components PDV, the metal layer MX1 and the device DV1 (or device DV1-A) are located within the accommodating space ASX. Up to here, a package structure PK1 according to some embodiments of the disclosure is accomplished.

FIG. 3A to FIG. 3E are schematic sectional views of various stages in a method of fabricating a package structure according to some other exemplary embodiments of the present disclosure. The embodiment illustrated in FIG. 3A to FIG. 3E is similar to the embodiment illustrated in FIG. 2A to FIG. 2F. Therefore, the same reference numerals are used to refer to the same or liked parts, and its detailed description will be omitted herein. The difference between the embodiments is in the way of forming the metal layer MX1 on the devices DV1.

Figure 3A:
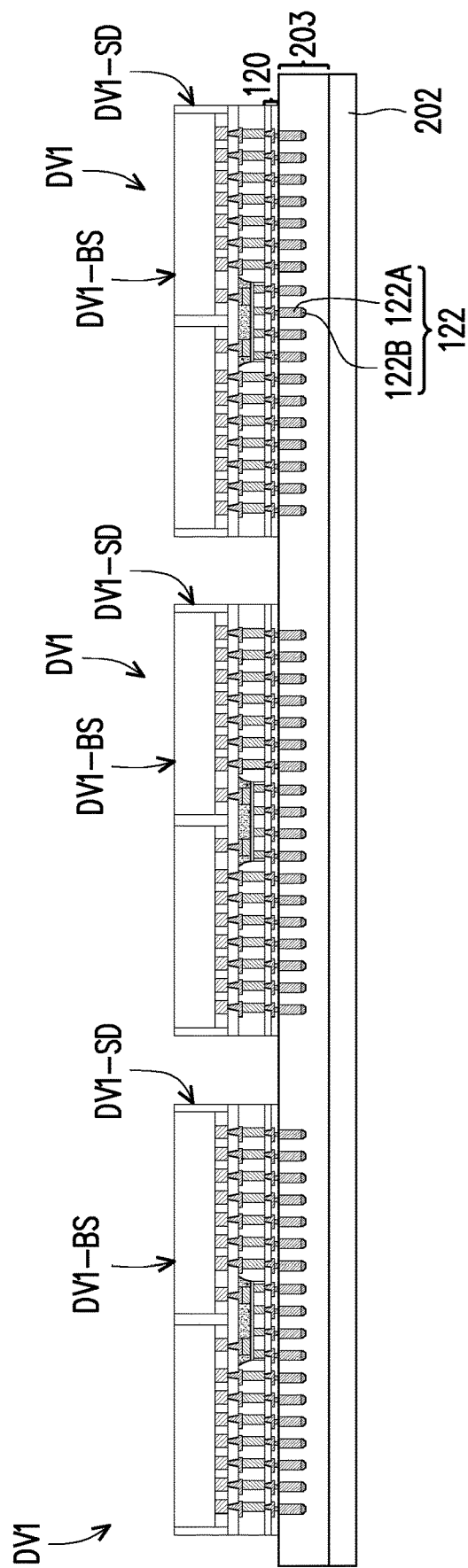
FIG. 3A to FIG. 3E are schematic sectional views of various stages in a method of fabricating a package structure according to some other exemplary embodiments of the present disclosure.

Referring to FIG. 3A, in some embodiments, the devices DV1 obtained in FIG. 1K may be placed on a tape 203. In some embodiments, the tape 203 is supported by a carrier 202. For example, the carrier 202 may be any type of carrier that is suitable for supporting the components located thereon. In some embodiments, the devices DV1 are placed on the tape 203 in a way that the conductive terminals 122 of the devices DV1 are embedded in the tape 203. For example, the conductive terminals 122 are distributed on front surfaces of the devices DV1, and the front surfaces (active surface) of the devices DV1 are attached to the tape 203 after placing the devices DV1 on the tape 203. In some embodiments, a top surface (e.g. the front surfaces) of the redistribution layer 120 is in contact with the tape 203. In certain embodiments, the devices DV1 are placed on the tape 203 in a flip-chip manner.

Figure 3B:
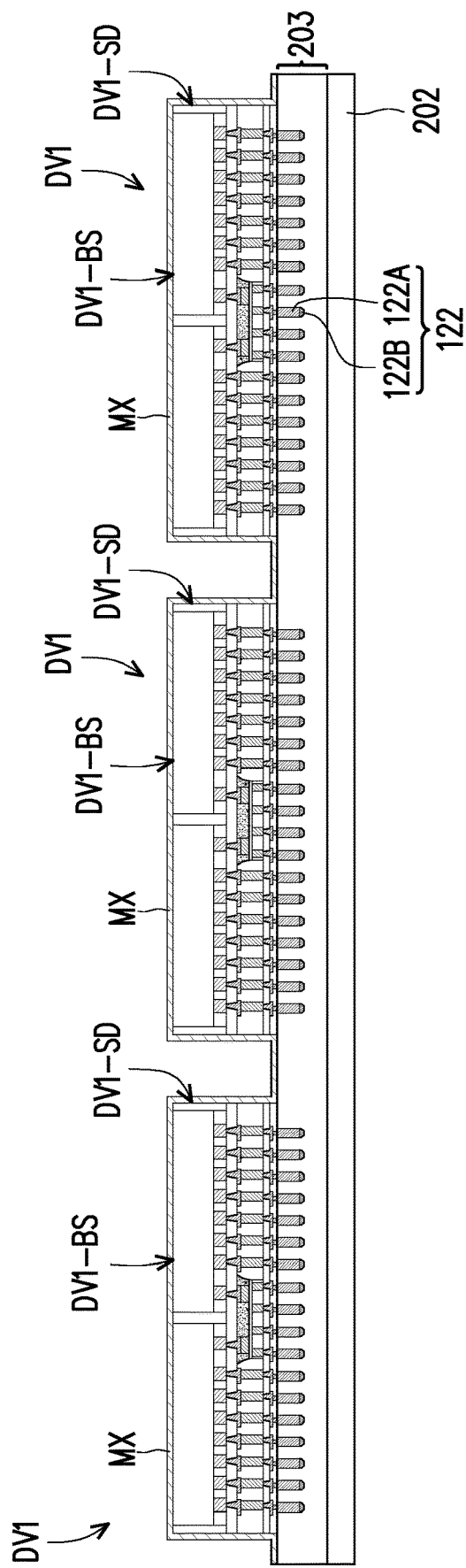

Referring to FIG. 3B, after placing the devices DV1 on the tape 203, a metallic material layer MX may be formed to cover the devices DV1 and the tape 203. In the exemplary embodiment, the metallic material layer MX is formed conformally over the tape 203 and the devices DV1. For example, the metallic material layer MX covers at least the backside surface DV1-BS and the side surfaces DV1-SD of the devices DV1, and cover portions of the tape 203. Similar to the embodiment described in FIG. 2A to FIG. 2F, the metallic material layer MX may be formed over the devices DV1 and the tape 203 through sputtering, printing, plating or the like. Furthermore, in some embodiments, the metallic material layer MX may include materials such as aluminum (Al), titanium (Ti), titanium nitride (TiN), nickel (Ni), nickel-vanadium (NW), gold (Au), silver (Ag), stainless steel (SUS), copper (Cu) or the like.

Figure 3C:
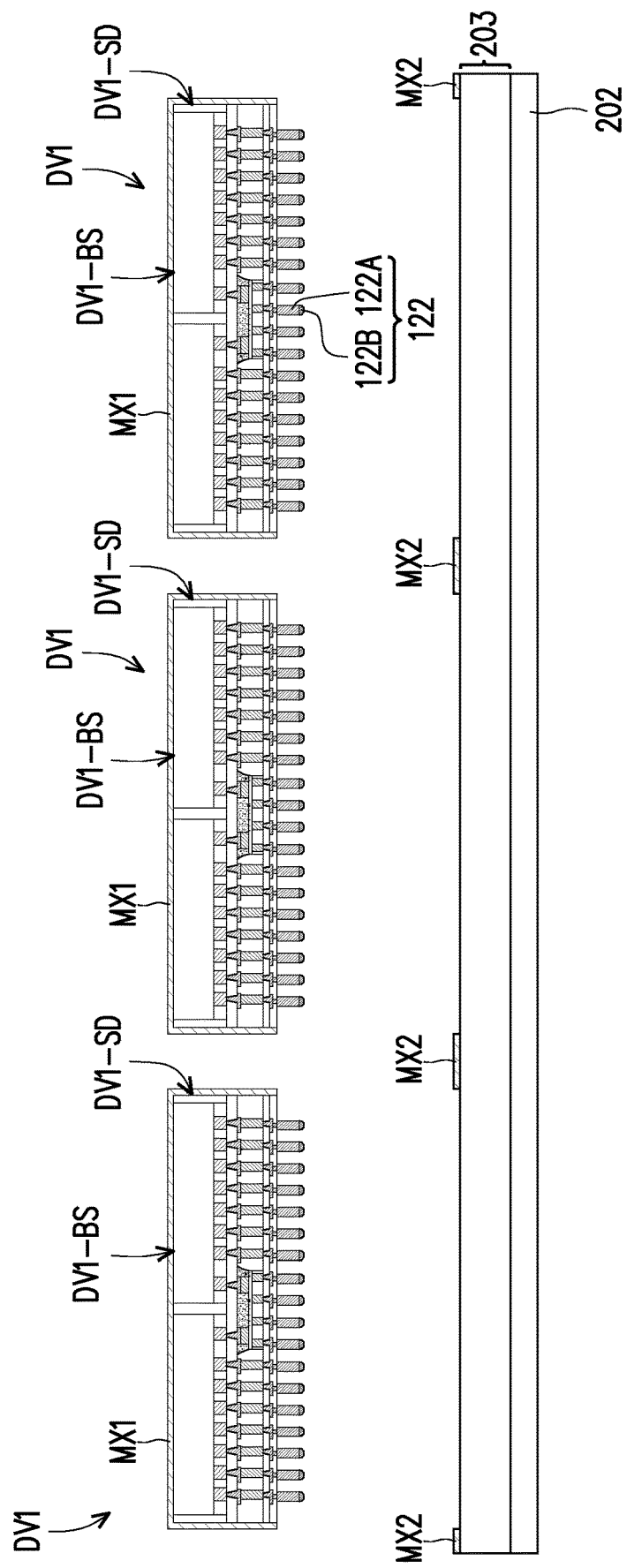

Referring to FIG. 3C, in a next step, after forming the metallic material layer MX, the devices DV1 covered by the metallic material layer MX may be picked up or removed from the tape 203. For example, the devices DV1 are picked up so that the metal layer MX1 of the metallic material layer MX is separated from a residue portion MX2 of the metallic material layer MX. In some embodiments, metal layer MX1 is remained on the devices DV1 and covers at least the backside surface DV1-BS of the devices DV1. In certain embodiments, the residue portion MX2 cover portions of the tape 203, and reveals another portion of the tape 203. In some embodiments, after removing the devices DV1 from the tape 203, the residue portion MX2 may be removed from the tape 203 for further processing.

Figure 3D:
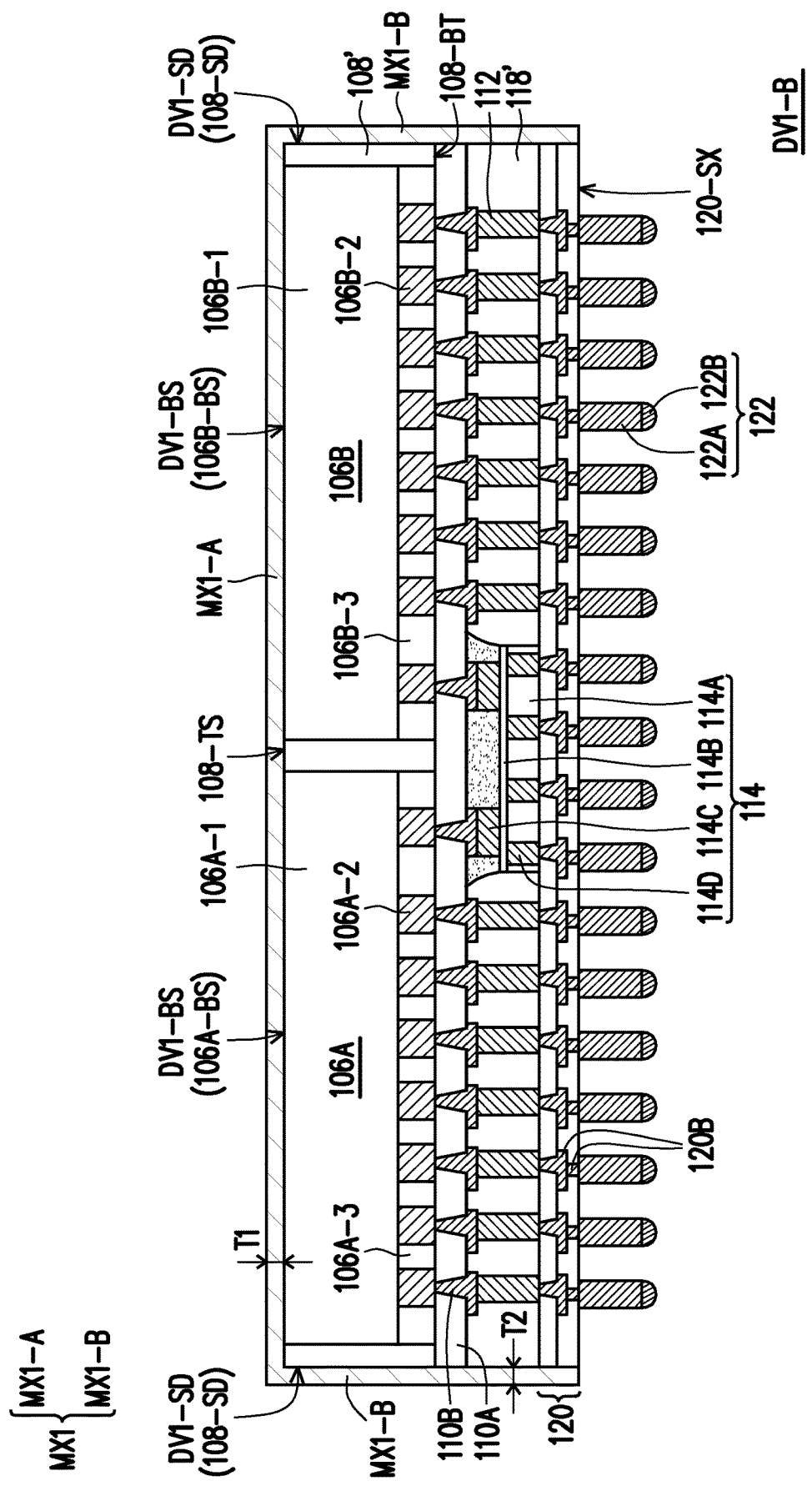

As illustrated in FIG. 3D, after picking up the devices DV1 from the tape 203, the obtained metal-coated device DV1-B includes the metal layer MX1 covered on the device DV1. In the exemplary embodiment, the metal layer MX1 covers a top surface 108-TS of the insulating encapsulation 108'. In some embodiments, the top surface 108-TS of the insulating encapsulation 108' is substantially leveled with the back surface 106A-BS of the first die 106A and leveled with the back surface 106B-BS of the second die 106B. In certain embodiments, the metal layer MX1 may include a first portion MX1-A and a second portion Mx1-B. For example, the first portion MX1-A covers the top surface 108-TS of the insulating encapsulation 108', and covers the backside surface DV1-BS of the devices DV1. The second portions MX1-B covers side surfaces 108-SD of the insulating encapsulation 108' and covers the side surfaces DV1-SD of the devices DV1. In certain embodiments, a surface of the second portions MX1-B of the metal layer MX1 is aligned with a surface of the redistribution layer 120.

Figure 3E:
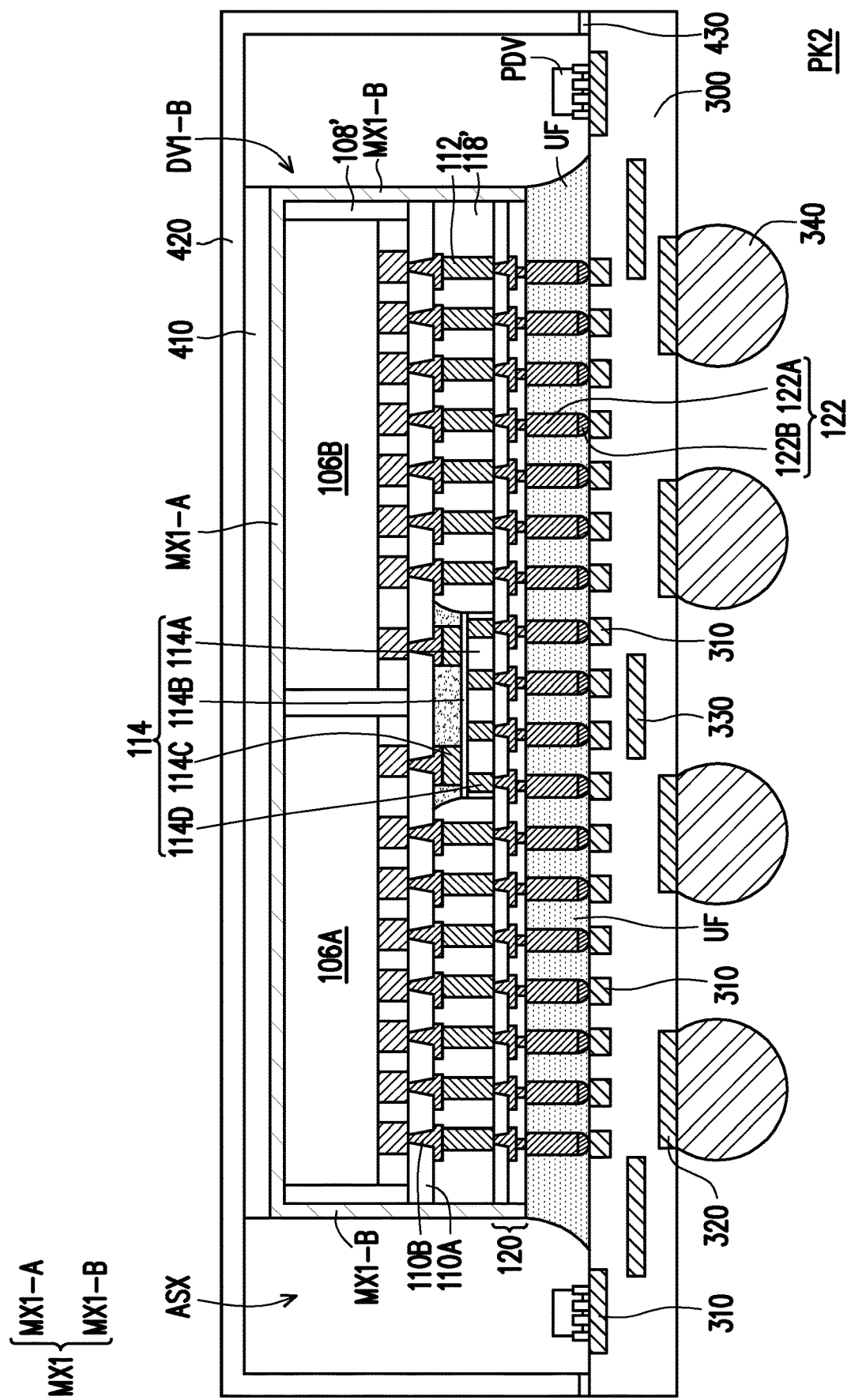

Referring to FIG. 3E, after obtaining the metal-coated device DV1-B (device DV1 covered by metal layer MX1), the device DV1-B is mounted or attached onto a circuit substrate 300 through the conductive terminals 122. The circuit substrate 300 is the same as that described in FIG. 2E, thus its detailed description will be omitted herein. Furthermore, the device DV1-B may be bonded to the circuit substrate 300 in the same way as device DV1-A. In some embodiments, an underfill UF is formed between the device DV1-B and the circuit substrate 300 to encapsulate conductive terminals 122 of the device DV1-B. In certain embodiments, the underfill UF may be in physical contact with the surface of the second portions MX1-B that is aligned with the surface of the redistribution layer 120. In some alternative embodiments, the underfill UF may also be in physical contact with sidewalls of the second portions MX1-B.

As illustrated in FIG. 3E, one or more passive components PDV (integrated passive device or surface mount devices) may be mounted on the circuit substrate 300. Furthermore, a lid 420 is mounted on the circuit substrate 300 and attached to the circuit substrate 300 through an adhesive material 430. In a similar way, the thermal interface material layer 410 is mounted on the metal layer MX1 (part of the metallic material layer MX) before mounting the lid 420 on the circuit substrate 300, whereby the thermal interface material layer 410 is sandwiched between the metal layer MX1 and the lid 420. In some embodiments, an accommodating spacing ASX is defined by the lid 420 and the circuit substrate 300, whereas the thermal interface material layer 410, the passive components PDV, the metal layer MX1 and the device DV1 (or device DV1-B) are located within the accommodating space ASX. Up to here, a package structure PK2 according to some embodiments of the disclosure is accomplished.

Figure 4A:
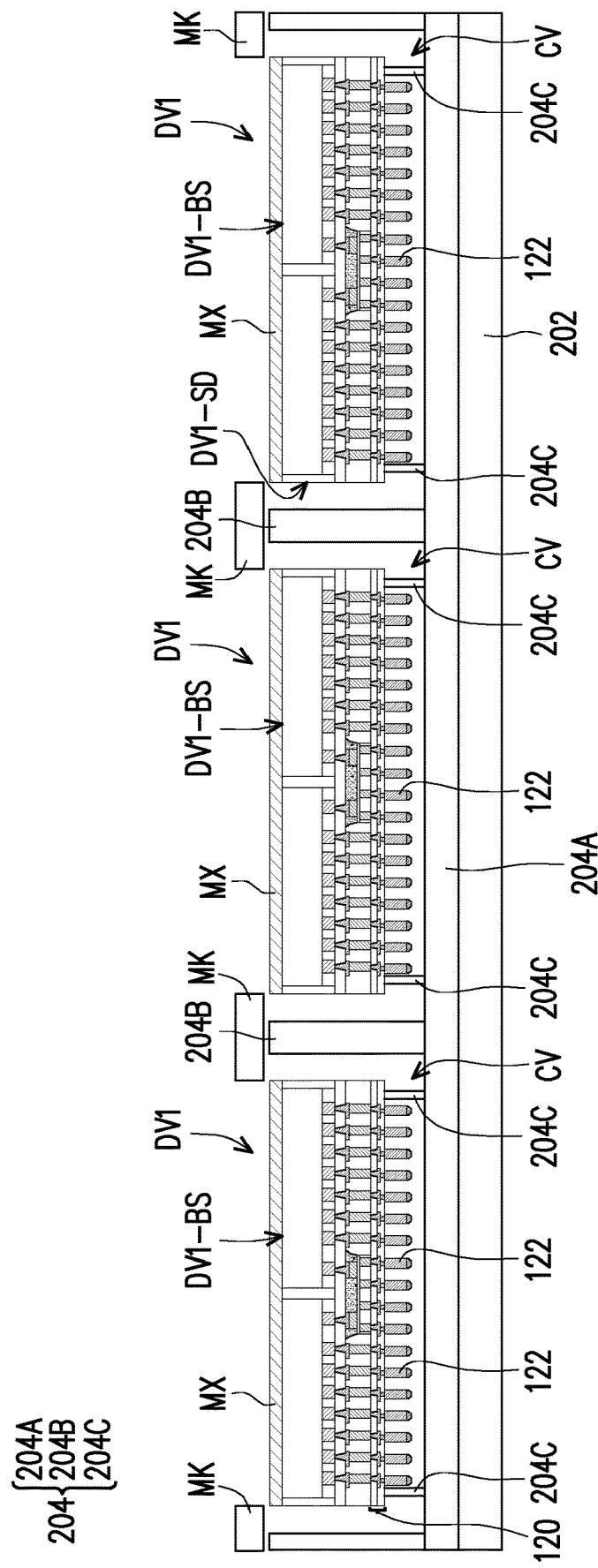
FIG. 4A and FIG. 4B are schematic sectional views of various stages in a method of fabricating a device according to some other exemplary embodiments of the present disclosure.
Figure 4B:
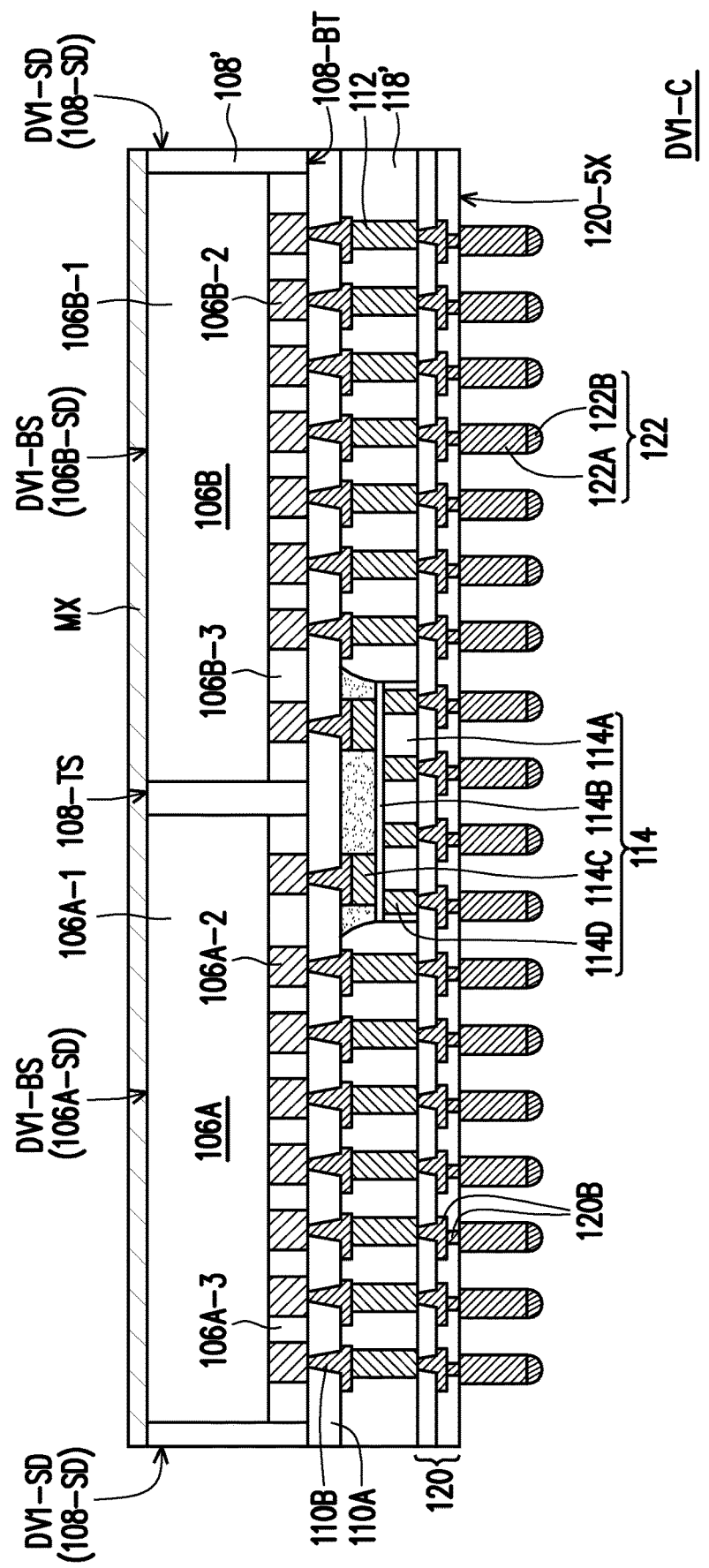

FIG. 4A and FIG. 4B are schematic sectional views of various stages in a method of fabricating a device according to some other exemplary embodiments of the present disclosure. The embodiment illustrated in FIG. 4A and FIG. 4B is similar to the embodiment illustrated in FIG. 2A to FIG. 2D. Therefore, the same reference numerals are used to refer to the same or liked parts, and its detailed description will be omitted herein. The difference between the embodiments is in the way of forming the metallic material layer MX (or metal layer) on the devices DV1.

Referring to FIG. 4A, the devices DV1 obtained in FIG. 1K may be placed in the cavities CV of a tray 204. In some embodiments, before forming the metallic material layer MX, a shielding mask MK may be provided over the devices DV1 and the tray 204. For example, the shielding mask MK may include apertures for exposing the backside surface DV1-BS of the devices DV1. In some embodiments, the metallic material layer MX (or metal layer) may be formed on the backside surface DV1-BS of the devices DV1 through the apertures of the shielding mask MK. In certain embodiments, the metallic material layer MX is formed on the devices through sputtering, printing, plating or the like.

Referring to FIG. 4B, after forming the metallic material layer MX, the shielding mask MK is removed, and the devices DV1 covered by the metallic material layer MX. may be picked up or removed from the tray 204. After picking up the devices DV1 from the tray 204, the obtained metal-coated device DV1-C includes a metallic material layer MX (single metal layer) covered on the device DV1. In the exemplary embodiment, the metallic material layer MX covers a top surface 108-TS of the insulating encapsulation 108'. In some embodiments, the top surface 108-TS of the insulating encapsulation 108' is substantially leveled with the back surface 106A-BS of the first die 106A and leveled with the back surface 106B-BS of the second die 106B. In certain embodiments, side surfaces of the metallic material layer MX are aligned with side surfaces 108-SD of the insulating encapsulation 108'. The obtained metal-coated device DV1-C may be further disposed on other components and be electrically connected to other components based on requirements.

Figure 5A:
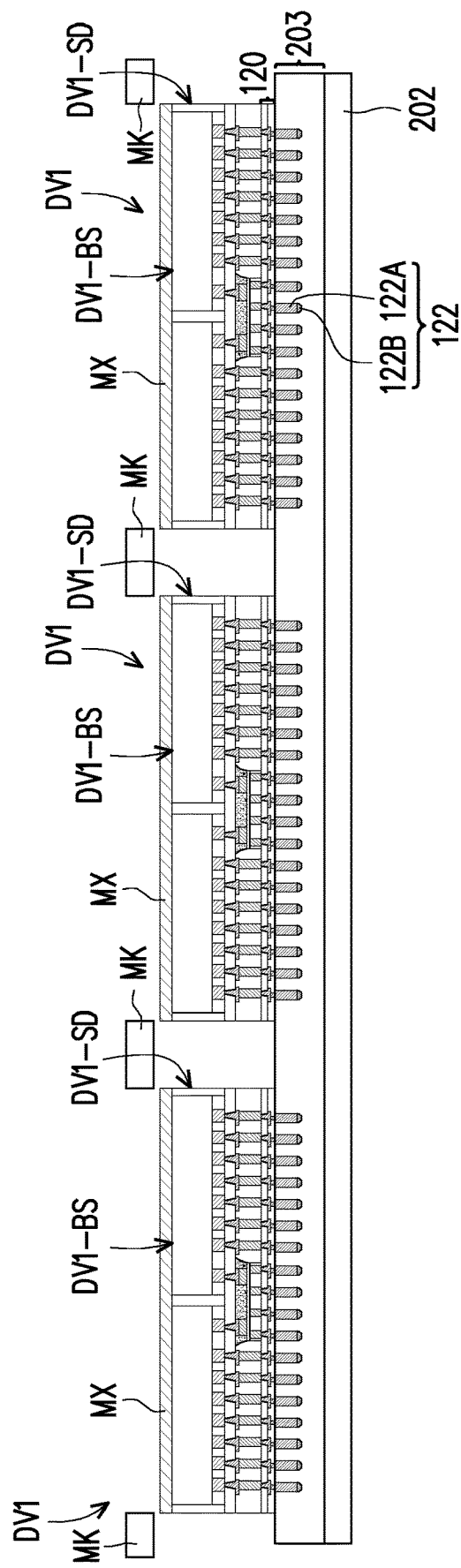
FIG. 5A and FIG. 5B are schematic sectional views of various stages in a method of fabricating a device according to some other exemplary embodiments of the present disclosure.
Figure 5B:
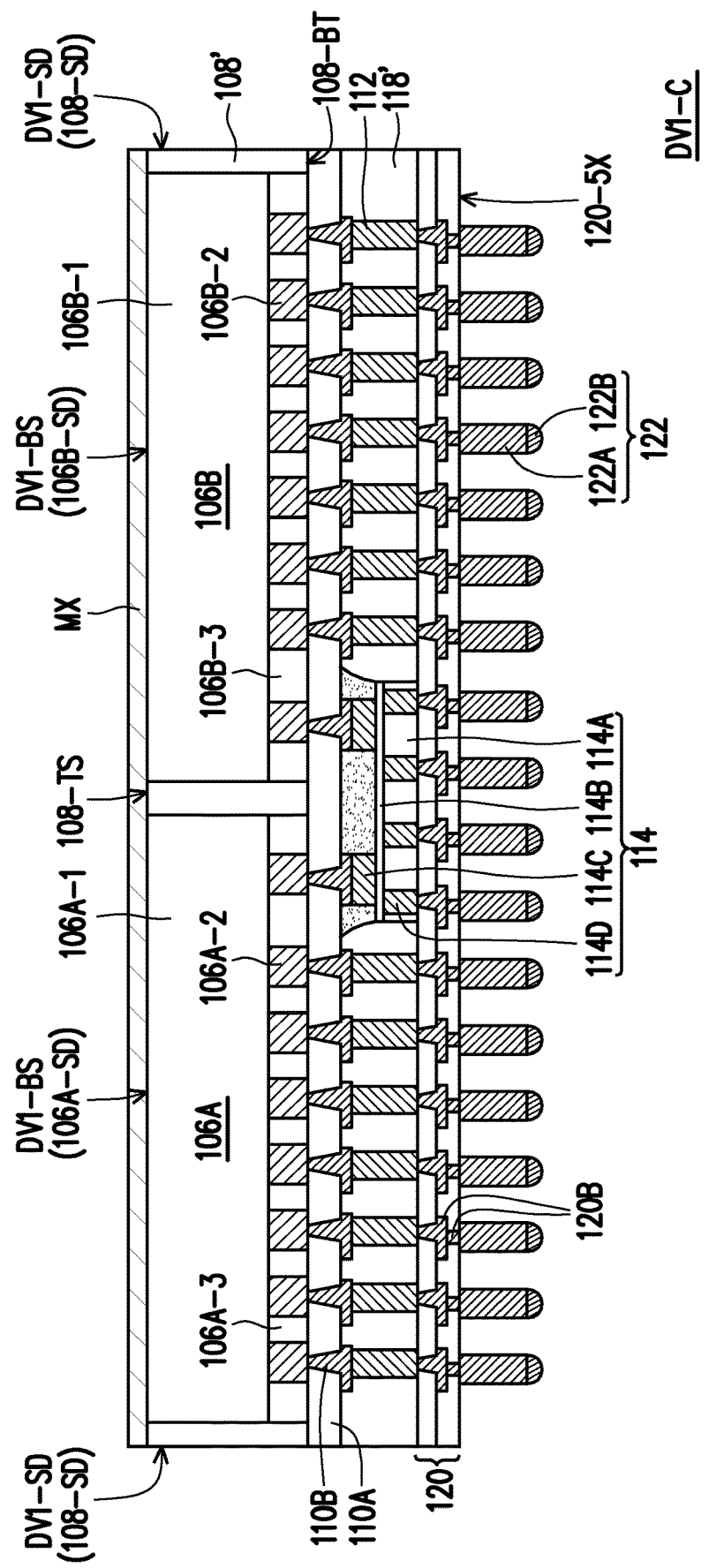

FIG. 5A and FIG. 5B are schematic sectional views of various stages in a method of fabricating a device according to some other exemplary embodiments of the present disclosure. The embodiment illustrated in FIG. 4A and FIG. 4B is similar to the embodiment illustrated in FIG. 3A to FIG. 3D. Therefore, the same reference numerals are used to refer to the same or liked parts, and its detailed description will be omitted herein. The difference between the embodiments is in the way of forming the metallic material layer MX (or metal layer) on the devices DV1.

Referring to FIG. 5A, in some embodiments, the devices DV1 obtained in FIG. 1K may be placed on a tape 203. In some embodiments, the tape 203 is supported by a carrier 202. In some embodiments, before forming the metallic material layer MX, a shielding mask MK may be provided over the devices DV1 and the tape 203. For example, the shielding mask MK may include apertures for exposing the backside surface DV1-BS of the devices DV1. In some embodiments, the metallic material layer MX (or metal layer) may be formed on the backside surface DV1-BS of the devices DV1 through the apertures of the shielding mask MK. In certain embodiments, the metallic material layer MX is formed on the devices through sputtering, printing, plating or the like.

Referring to FIG. 5B, after forming the metallic material layer MX, the shielding mask MK is removed, and the devices DV1 covered by the metallic material layer MX. may be picked up or removed from the tape 203. After picking up the devices DV1 from the tape 203, the obtained metal-coated device DV1-C includes a metallic material layer MX (single metal layer) covered on the device DV1. In the exemplary embodiment, the metallic material layer MX covers a top surface 108-TS of the insulating encapsulation 108'. In some embodiments, the top surface 108-TS of the insulating encapsulation 108' is substantially leveled with the back surface 106A-BS of the first die 106A and leveled with the back surface 106B-BS of the second die 106B. In certain embodiments, side surfaces of the metallic material layer MX is aligned with side surfaces 108-SD of the insulating encapsulation 108'. The obtained metal-coated device DV1-C may be further disposed on other components and be electrically connected to other components based on requirements.

Figure 6:
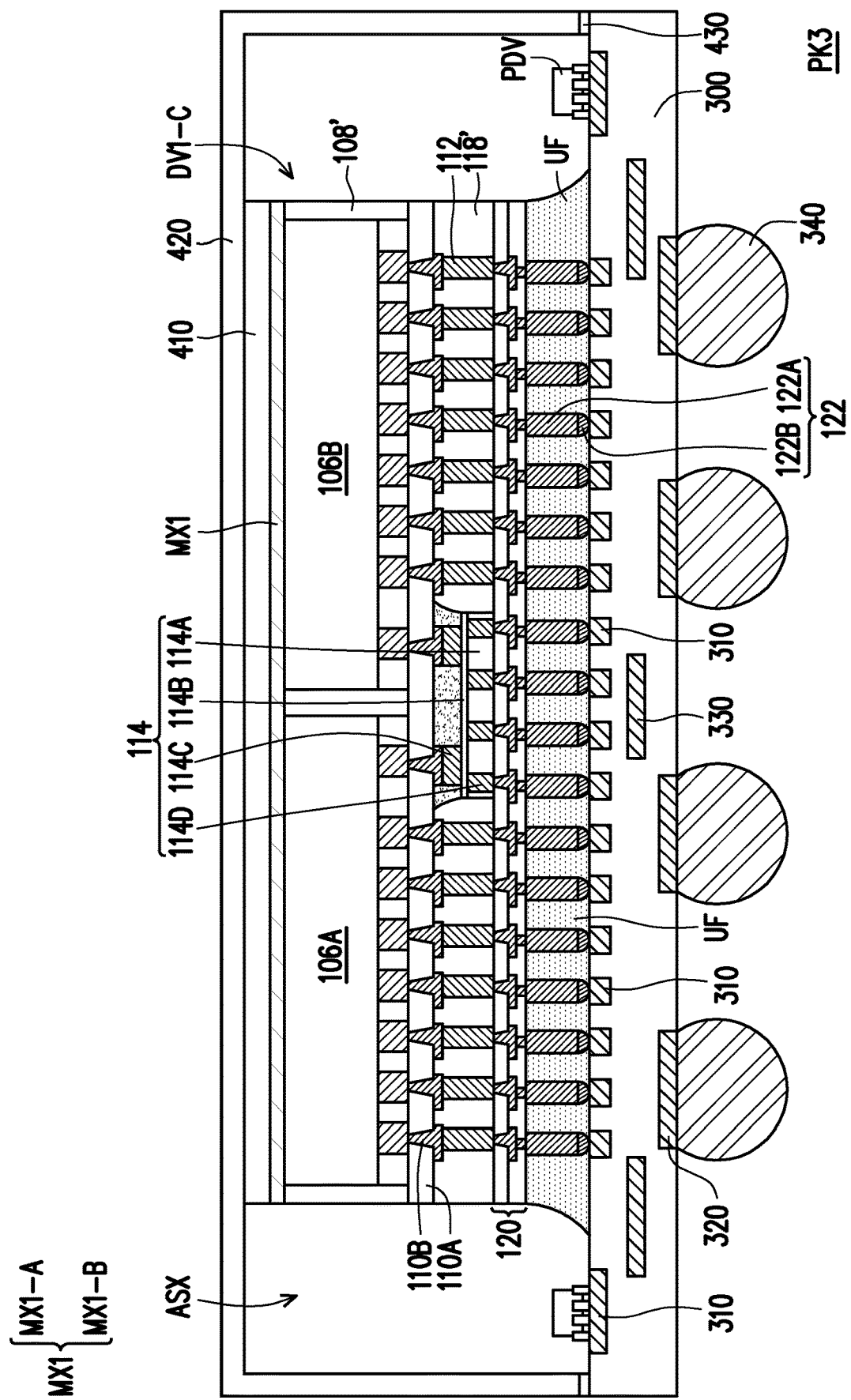
FIG. 6 is a schematic sectional view of a package structure according to some other exemplary embodiments of the present disclosure.

FIG. 6 is a schematic sectional view of a package structure according to some other exemplary embodiments of the present disclosure. The package structure PK3 illustrated in FIG. 6 is similar to the package structure PK2 illustrated in FIG. 3E. Therefore, the same reference numerals are used to refer to the same or liked parts, and its detailed description will be omitted herein. The difference between the embodiments is in the type of device mounted on the circuit substrate 300. As illustrated in FIG. 6, the metal-coated device DV1-C obtained in FIG. 4B or FIG. 5B may be mounted on the circuit substrate 300 in replacement of the metal-coated device DV1-B shown in FIG. 3E. In a similar way, the thermal interface material layer 410 is mounted on the metallic material layer MX, and a lid 420 is attached onto the circuit substrate 300 through an adhesive material 430. Furthermore, one or more passive components PDV (integrated passive device or surface mount devices) may be mounted on the circuit substrate 300 prior to the attachment of the lid 420. After attaching the lid 420 on the circuit substrate 300, the package structure PK3 according to some other embodiments of the disclosure may be accomplished.

FIG. 7A to FIG. 7G are schematic sectional views of various stages in a method of fabricating another device according to some exemplary embodiments of the present disclosure. Referring to FIG. 1A, an interposer structure 200 is provided. In some embodiments, the interposer structure 200 includes a core portion 202, and a plurality of through vias 204 and conductive pads 206 formed therein. In some embodiments, the core portion 202 may be a substrate such as a bulk semiconductor substrate, silicon on insulator (SOI) substrate or a multi-layered semiconductor material substrate. The semiconductor material of the substrate (core portion 202) may be silicon, germanium, silicon germanium, silicon carbide, gallium arsenic, gallium phosphide, indium phosphide, indium arsenide, indium antimonide, GaAsP, AlInAs, AlGaAs, GaInAs, GaInP, GaInAsP, or combinations thereof. In some embodiments, the core portion 202 may be doped or undoped.

In some embodiments, the conductive pads 206 are formed on a first surface 202a of the core portion 202. In some embodiments, through vias 204 are formed in the core portion 202 and connected with the conductive pads 206. In some embodiments, the through vias 204 extend into the core portion 202 with a specific depth. In some embodiments, the through vias 204 are through-substrate vias. In some embodiments, the through vias 204 are through-silicon vias when the core portion 202 is a silicon substrate. In some embodiments, the through vias 204 may be formed by forming holes or recesses in the core portion 202 and then filling the recesses with a conductive material. In some embodiments, the recesses may be formed by, for example, etching, milling, laser drilling or the like. In some embodiments, the conductive material may be formed by an electrochemical plating process, chemical vapor deposition (CVD), atomic layer deposition (ALD) or physical vapor deposition (PVD), and the conductive material may include copper, tungsten, aluminum, silver, gold or a combination thereof. In some embodiments, the conductive pads 206 connected with the through vias 204 may be formed as conductive parts of the redistribution layer(s) formed on the interposer structure 200. In some embodiments, the conductive pads 206 include under bump metallurgies (UBMs). In certain embodiments, the interposer structure 200 may further include active or passive devices, such as transistors, capacitors, resistors, or diodes passive devices formed in the core portion 202.

Figure 7A:
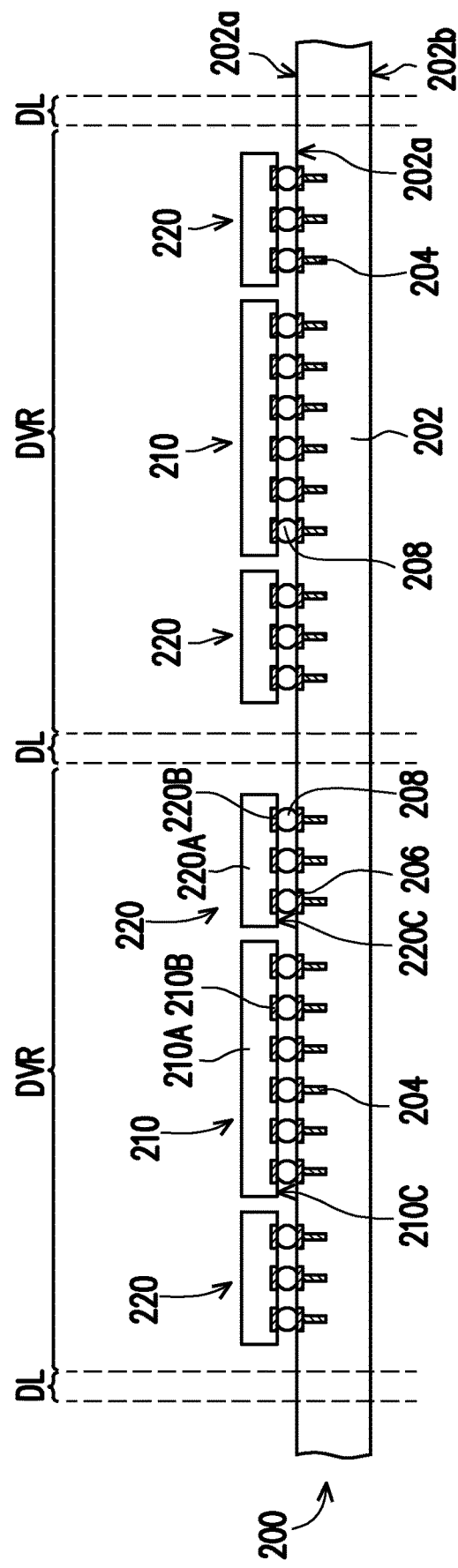
FIG. 7A to FIG. 7G are schematic sectional views of various stages in a method of fabricating another device according to some exemplary embodiments of the present disclosure.

As further illustrated in FIG. 7A, the core portion 202 has a plurality of device regions DVR and dicing lines DL separating each of the plurality of device regions DVR. The through vias 204 and conductive pads 206 are formed in the core portion 202 within the device regions DVR. In some embodiments, the semiconductor dies 210 and semiconductor dies 220 are provided on the interposer structure 200, or on the core portion 202 within the device regions DVR. The semiconductor dies 210 and semiconductor dies 220 are individual dies singulated from a wafer. In some embodiments, the semiconductor dies 210 contain the same circuitry, such as devices and metallization patterns, or the semiconductor dies 210 are the same type of dies. In some embodiments, the semiconductor dies 220 contain the same circuitry, or the semiconductor dies 220 are the same type of dies. In certain embodiments, the semiconductor dies 210 and the semiconductor dies 220 have different circuitry or are different types of dies. In alternative embodiments, the semiconductor dies 210 and the semiconductor dies 220 may have the same circuitry.

In some embodiments, the semiconductor dies 210 may be major dies, while the semiconductor dies 220 are tributary dies. In some embodiments, the major dies are arranged on the core portion 202 in central locations of each device regions DVR, while tributary dies are arranged side-by-side and spaced apart from the major dies. In some embodiments, the tributary dies are arranged aside the major dies, and around or surrounding the major dies. In one embodiment, four or six tributary dies are arranged around one major die per one device region DVR.

In certain embodiments, the semiconductor dies 210 has a surface area larger than that of the semiconductor dies 220. Also, in some embodiments, the semiconductor dies 210 and the semiconductor dies 220 may be of different sizes, including different surface areas and/or different thicknesses. In some embodiments, the semiconductor dies 210 may be a logic die, including a central processing unit (CPU) die, graphics processing unit (GPU) die, system-on-a-chip (SoC) die, a microcontroller or the like. In some embodiments, the semiconductor dies 210 is a power management die, such as a power management integrated circuit (PMIC) die. In some embodiments, the semiconductor dies 220 may be a memory die, including dynamic random access memory (DRAM) die, static random access memory (SRAM) die or a high bandwidth memory (HBM) die. The disclosure is not limited thereto, and the number, sizes and types of the semiconductor die disposed on the core portion 202 may be appropriately adjusted based on product requirement.

In the illustrated embodiment, the semiconductor dies 210 include a body 210A and connecting pads 210B formed on an active surface 210C of the body 210A. In certain embodiments, the connecting pads 210B may further include pillar structures for bonding the semiconductor dies 210 to other structures. In some embodiments, the semiconductor dies 220 include a body 220A and connecting pads 220B formed on an active surface 220C of the body 220A. In other embodiments, the connecting pads 220B may further include pillar structures for bonding the dies 220 to other structures.

In some embodiments, the semiconductor dies 210 and the semiconductor dies 220 are attached to the first surface 202a of the core portion 202, for example, through flip-chip bonding by way of the electrical connectors 208. Through the reflow process, the electrical connectors 208 are formed between the connecting pads 210A, 210B and conductive pads 206, electrically and physically connecting the semiconductor dies 210, 220 to the core portion 202 of the interposer structure 200. In some embodiments, the electrical connectors 208 are located in between the semiconductor dies 210, 220 and the interposer structure 200. In certain embodiments, semiconductor dies 210, 220 are electrically connected to the through vias 204 and the conductive pads 206 through the electrical connectors 208. In one embodiment, the electrical connectors 208 are micro-bumps, such as micro-bumps having copper metal pillars. In another embodiment, the electrical connectors 208 are solder bumps, lead-free solder bumps, or micro bumps, such as controlled collapse chip connection (C4) bumps or micro bumps containing copper pillars. In some embodiments, the bonding between the semiconductor dies 210, 220 and the core portion 202 may be solder bonding. In some embodiments, the bonding between the semiconductor dies 210, 220 and the core portion 202 may be direct metal-to-metal bonding, such as copper-to-copper bonding.

Figure 7B:
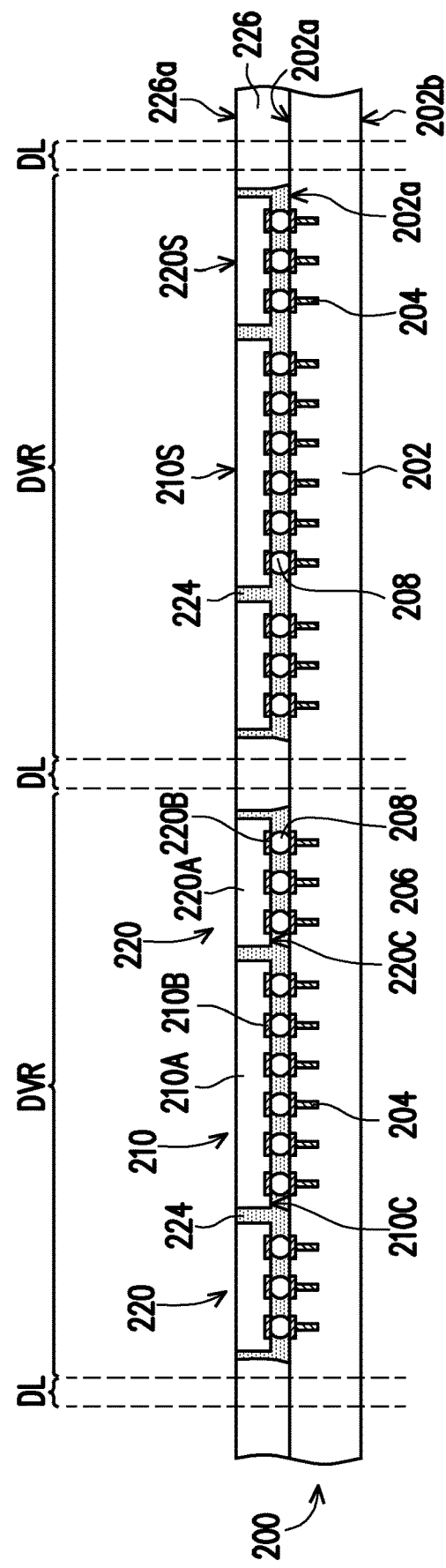

Referring to FIG. 7B, in a next step, an underfill structure 224 may be formed to cover the plurality of electrical connectors 208, and to fill up the spaces in between the semiconductor dies 210, 220 and the interposer structure 200. In some embodiments, the underfill structure 224 further cover side walls of the semiconductor dies 210, 220, and is located within the device region DVR. Thereafter, an insulating encapsulation 226 may be formed over the interposer structure 200 (or over the core portion 202) to cover the underfill structure 224, and to surround the semiconductor dies 210 and 220.

In some embodiments, the insulating encapsulation 226 is formed on the first surface 202a of the core portion 202 in the device region and over the dicing lines DL. In some embodiments, the insulating encapsulation 226 is formed through, for example, a compression molding process or transfer molding. In one embodiment, a curing process is performed to cure the insulating encapsulation 226. In some embodiments, the semiconductor dies 210, 220 and the electrical connectors 208 are encapsulated by the insulating encapsulation 226. In some embodiments, a planarization process, including grinding or polishing, may be performed to partially remove the insulating encapsulation 226, exposing backside surfaces 210s, 220s of the semiconductor dies 210, 220. Accordingly, the backside surfaces 210s, 220s of the semiconductor dies 210, 220 are levelled with a top surface 226a of the insulating encapsulation 226. The top surface 226a being opposite to a backside surface 226b of the insulating encapsulation 226, wherein the backside surface 226b is in contact with the core portion 202.

In some embodiments, a material of the insulating encapsulation 226 includes polymers (such as epoxy resins, phenolic resins, silicon-containing resins, or other suitable resins), dielectric materials having low permittivity (Dk) and low loss tangent (Df) properties, or other suitable materials. In an alternative embodiment, the insulating encapsulation 226 may include an acceptable insulating encapsulation material. In some embodiments, the insulating encapsulation 226 may further include inorganic filler or inorganic compound (e.g. silica, clay, and so on) which can be added therein to optimize coefficient of thermal expansion (CTE) of the insulating encapsulation 226. The disclosure is not limited thereto.

Figure 7C:
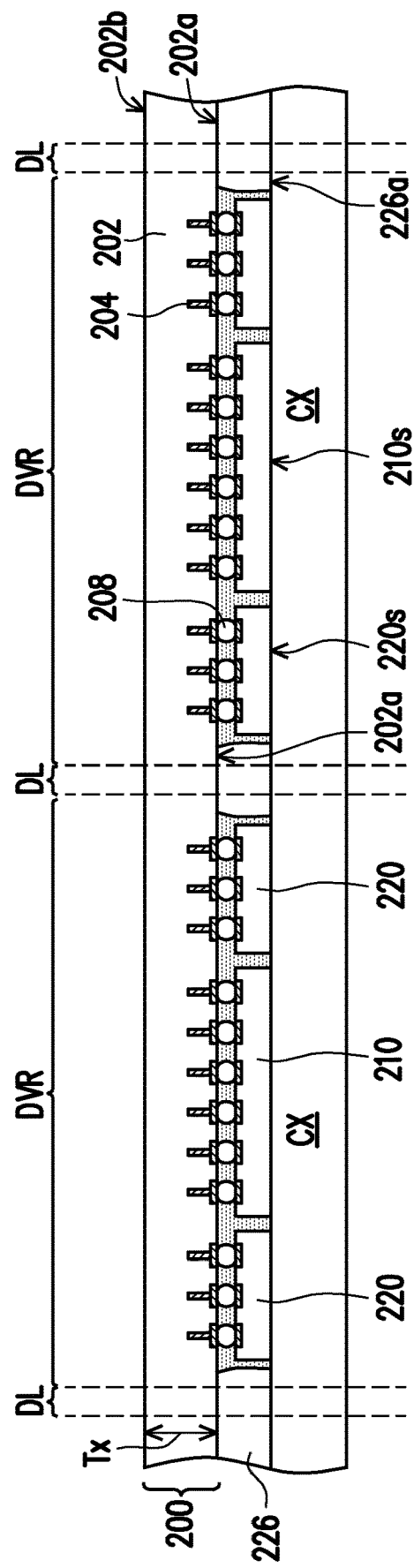

Referring to FIG. 7C, the structure of FIG. 7B is turned upside down or flipped, and placed on a carrier Cx, so that the carrier Cx directly contacts the backside surfaces 210s, 220s of the semiconductor dies 210, 220 and the top surface 226a of the insulating encapsulation 226. As shown in FIG. 7C, at this stage of processing, the interposer structure 200 has not been thinned and has a thickness Tx. In other words, the through vias 204 are not revealed, and are embedded in the core portion 202 of the interposer structure 200.

Figure 7D:
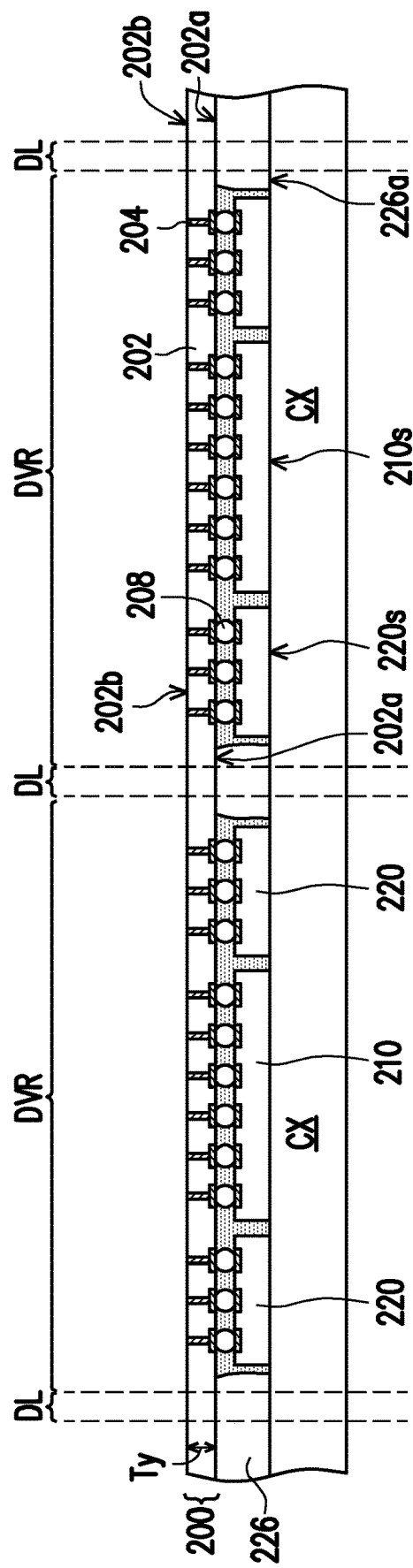

Referring to FIG. 7D, a thinning process is performed to the interposer 200 to partially remove or thin the core portion 202 of the interposer structure 200 until the through vias 204 are exposed and a second surface 202b of the core portion 202 is formed. In some embodiments, the thinning process may include a back-grinding process, a polishing process or an etching process. In some embodiments, after the thinning process, the interposer structure 200 is thinned to a thickness Ty. In some embodiments, a ratio of the thickness Ty to the thickness Tx ranges from about 0.1 to about 0.5.

Figure 7E:
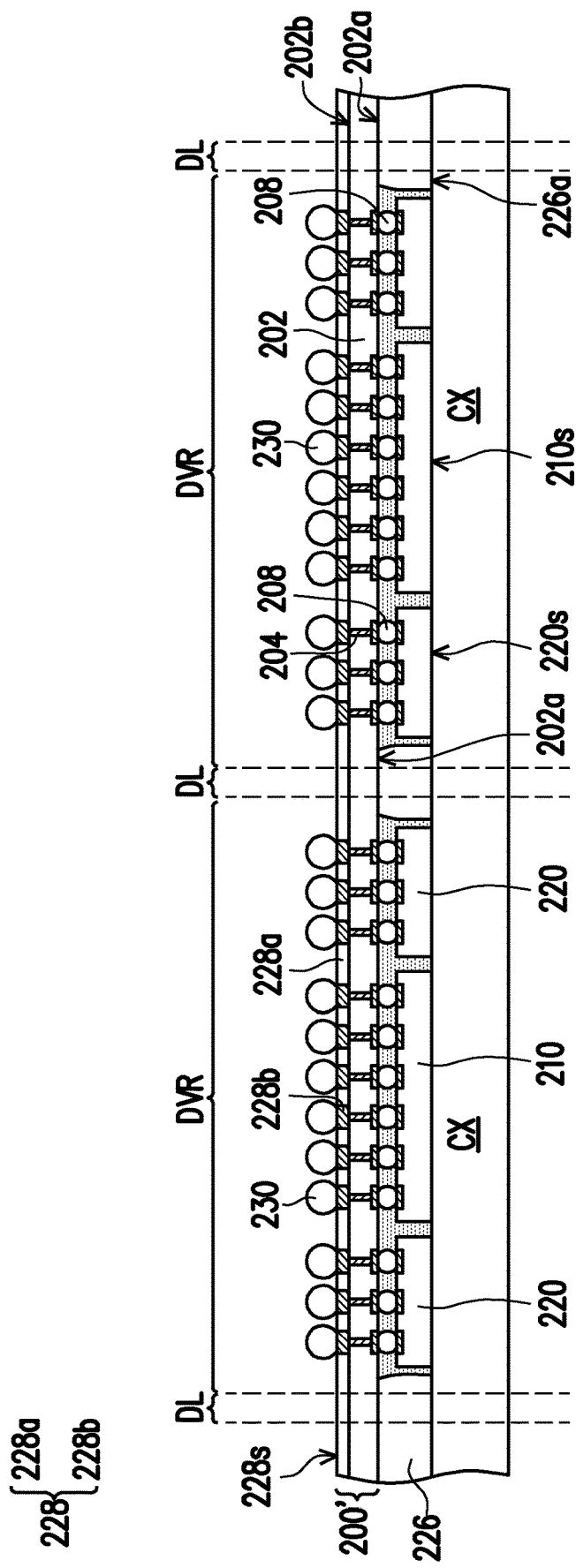

Referring to FIG. 7E, a redistribution structure 228 is formed on the second surface 202b of the core portion 202 in the device region DVR and over the dicing lines DL. The second surface 202b being opposite to the first surface 202a of the core portion 202. In some embodiments, the redistribution structure 228, the core portion 202, the through vias 204 and conductive pads 206 constitutes the interposer structure 200'. In some embodiments, the redistribution structure 228 electrically connects the through vias 204 and/or electrically connects the through vias 204 with external devices. In certain embodiments, the redistribution structure 228 includes at least one dielectric layer 228a and metallization patterns 228b in the dielectric layer 228a. In some embodiments, the metallization patterns 228b may comprise pads, vias and/or trace lines to interconnect the through vias 204 and to further connect the through vias 204 to one or more external devices. Although one layer of dielectric layer 228a, and one layer of the metallization patterns 228b is shown in FIG. 7E, it should be noted that the number of layers of the dielectric layer 228a and the metallization patterns 228b is not limited thereto, and could be adjusted based on requirement.

In some embodiments, the material of the dielectric layer 228a comprises silicon oxide, silicon nitride, silicon carbide, silicon oxynitride, or low-K dielectric materials (such as phosphosilicate glass materials, fluorosilicate glass materials, boro-phosphosilicate glass materials, SiOC, spin-on-glass materials, spin-on-polymers or silicon carbon materials). In some embodiments, the dielectric layer 228a may be formed by spin-coating or deposition, including chemical vapor deposition (CVD), PECVD, HDP-CVD, or the like. In some embodiments, the metallization patterns 228b include under-metal metallurgies (UBMs). In some embodiments, the formation of the metallization patterns 228b may include patterning the dielectric layer using photolithography techniques and one or more etching processes and filling a metallic material into the openings of the patterned dielectric layer. Any excessive conductive material on the dielectric layer may be removed, such as by using a chemical mechanical polishing process. In some embodiments, the material of the metallization patterns 228b includes copper, aluminum, tungsten, silver, and combinations thereof.

As further illustrated in FIG. 7E, a plurality of conductive terminals 230 is disposed on the metallization patterns 228b, and are electrically coupled to the through vias 204. In some embodiments, the conductive terminals 230 are placed on the top surface 116s of the redistribution structure 228, and electrically connected to the through vias 204 by the metallization patterns 228b within the device region DVR. In certain embodiments, the conductive terminals 230 are positioned on and physically attached to the metallization patterns 228b. In some embodiments, the conductive terminals 230 include lead-free solder balls, solder balls, ball grid array (BGA) balls, bumps, C4 bumps or micro bumps. In some embodiments, the conductive terminals 230 may include a conductive material such as solder, copper, aluminum, gold, nickel, silver, palladium, tin, or a combination thereof. In some embodiments, the conductive terminals 230 are formed by forming the solder paste on the redistribution structure 228 by, for example, evaporation, electroplating, printing or solder transfer and then reflowed into the desired bump shapes. In some embodiments, the conductive terminals 230 are placed on the redistribution structure 228 by ball placement or the like. In other embodiments, the conductive terminals 230 are formed by forming solder-free metal pillars (such as a copper pillar) by sputtering, printing, electroless or electro plating or CVD, and then forming a lead-free cap layer by plating on the metal pillars. The conductive terminals 230 may be used to bond to an external device or an additional electrical component. In some embodiments, the conductive terminals 230 are used to bond to a circuit substrate, a semiconductor substrate or a packaging substrate.

Figure 7F:
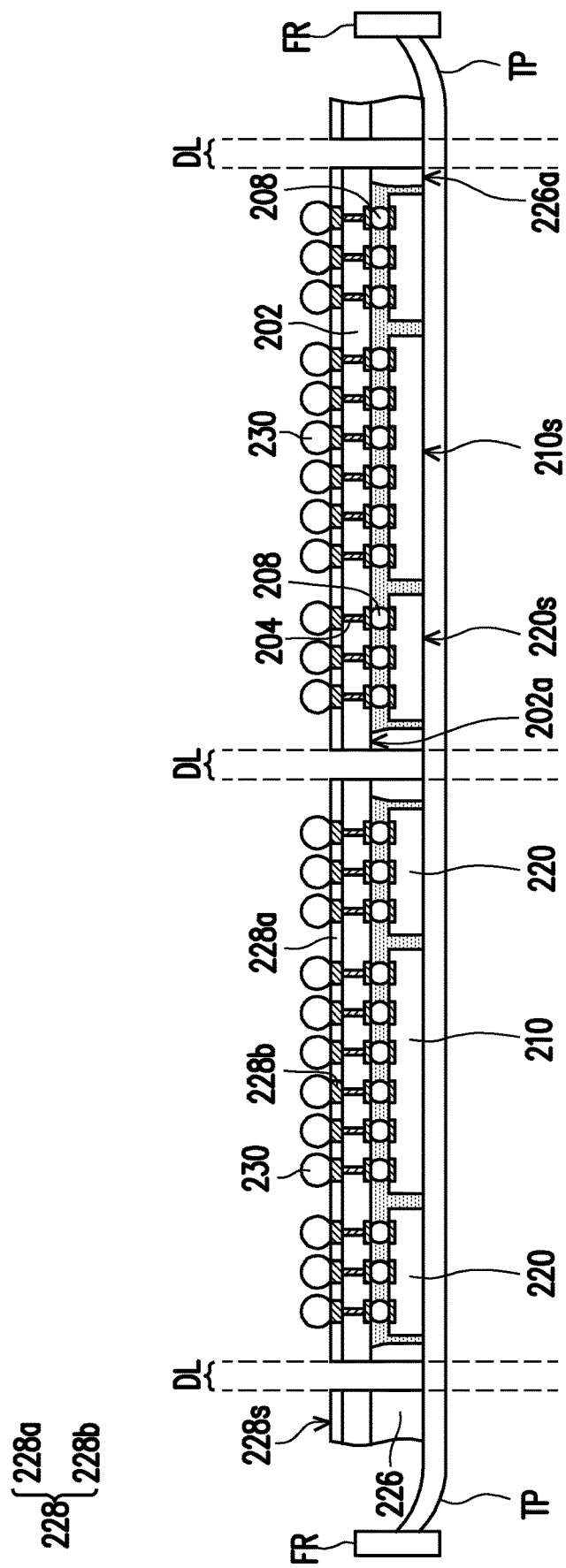
Figure 7G:
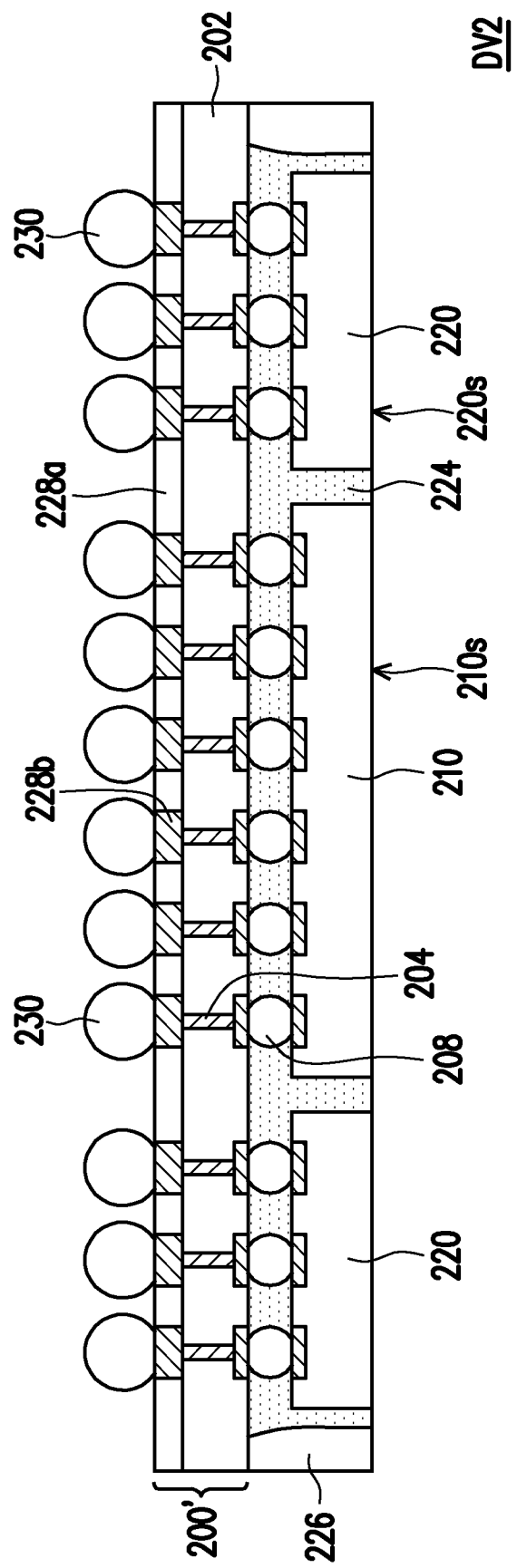

Referring to FIG. 7F, in a next step, the carrier Cx is de-bonded. For example, the de-bonding process includes projecting a light such as a laser light or an UV light on a debond layer (e.g., light-to-heat-conversion release layer) that is attached to the carrier Cx (not shown), so that the carrier Cx can be easily removed along with the debond layer. Thereafter, the structure shown in FIG. 1E is attached to a tape TP (e.g., a dicing tape) supported by a frame FR, and is diced or singulated along the dicing lines DL to form a plurality of devices. For example, the dicing process is performed to cut through the redistribution structure 228, the core portion 202, and the insulating encapsulation 226 to remove portions of the redistribution structure 228, the core portion 202, and the insulating encapsulation 226 along the dicing lines DL. In some embodiments, the dicing process or the singulation process typically involves dicing with a rotating blade or a laser beam. In other words, the dicing or singulation process is, for example, a laser cutting process, a mechanical sawing process, or other suitable processes. After the dicing process, the singulated semiconductor device DV2 (corresponding to the components in the device region DVR) illustrated in FIG. 7G can be obtained.

Figure 8:
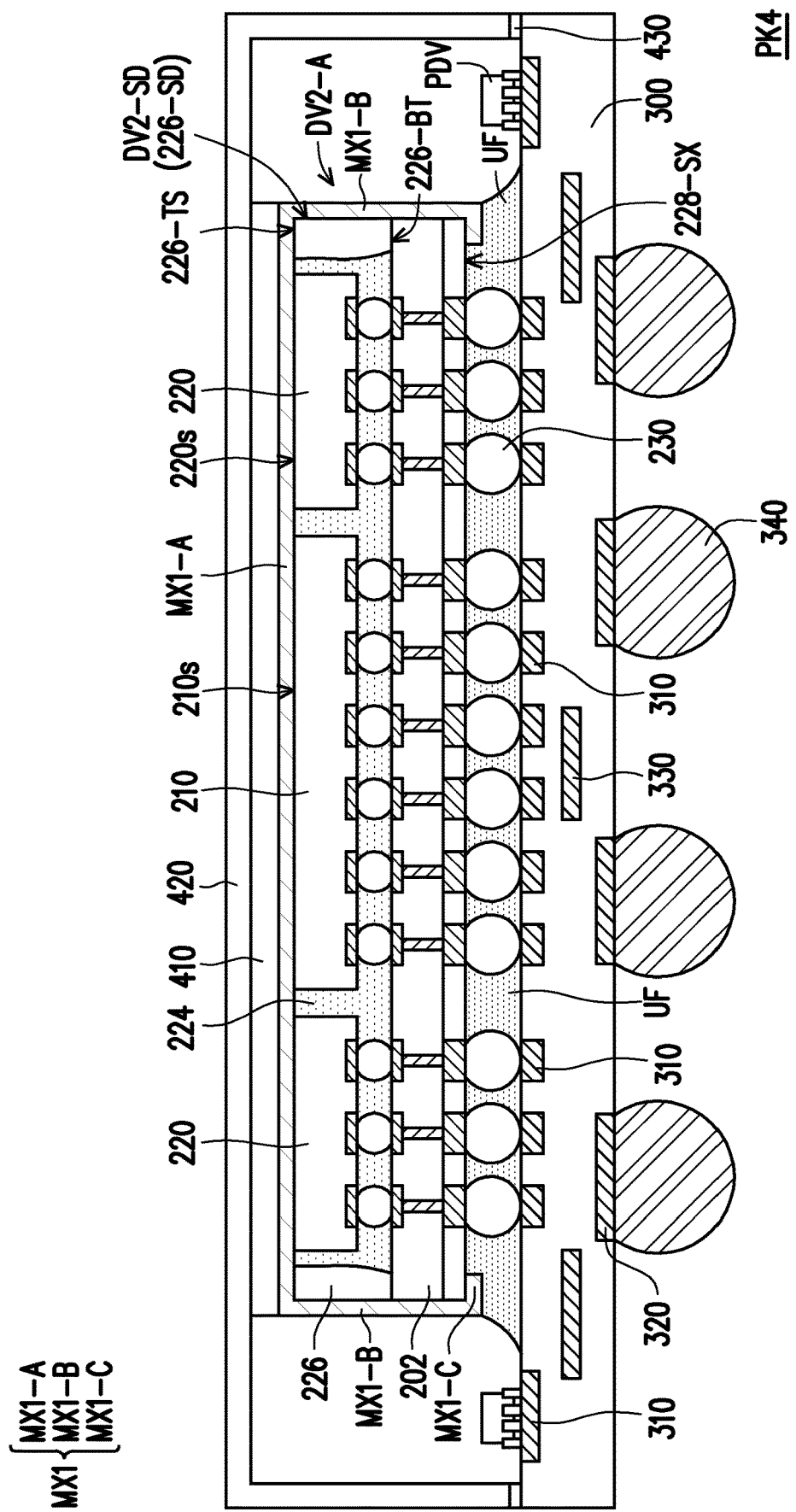
FIG. 8 is a schematic sectional view of a package structure according to some other exemplary embodiments of the present disclosure.

FIG. 8 is a schematic sectional view of a package structure according to some other exemplary embodiments of the present disclosure. The package structure PK4 illustrated in FIG. 8 is similar to the package structure PK1 illustrated in FIG. 2F. Therefore, the same reference numerals are used to refer to the same or liked parts, and its detailed description will be omitted herein. The difference between the embodiments is that a metal-coated device DV2-A in FIG. 8 is used in replacement of the metal-coated device DV1-A in FIG. 2F.

As illustrated in FIG. 8, a metal-coated device DV2-A is disposed on the circuit substrate 300. In the exemplary embodiment, the metal-coated device DV2-A may be obtained by forming a metal layer MX1 on the device DV2 shown in FIG. 7G. For example, the metal layer MX1 may be formed on the device DV2 using the same method described in FIG. 2A to FIG. 2D. In other words, a metal layer MX1 including a first portion MX1-A, second portions MX1-B and third portions MX1-C is formed on the device DV2. In some embodiments, the metal layer MX1 covers a top surface 226-TS of the insulating encapsulation 226. In some embodiments, the top surface 226-TS of the insulating encapsulation 226 is substantially leveled with the back surfaces 210s, 220s of the semiconductor dies 210, 220. In certain embodiments, the first portion MX1-A covers the top surface 226-TS of the insulating encapsulation 226, and covers the backside surface DV2-BS of the devices DV2. The second portions MX1-B covers side surfaces 226-SD of the insulating encapsulation226 and covers the side surfaces DV2-SD of the devices DV2. The third portions MX1-C partially covers a bottom surface 226-BT of the insulating encapsulation 108', whereby the bottom surface 226-BT is opposite to the top surface 226-TS.

In some embodiments, after bonding the metal-coated device DV2-A (device DV2 covered by metal layer MX1) onto the circuit substrate 300, an underfill UF is formed between the device DV2-A and the circuit substrate 300 to encapsulate the conductive terminals 230 of the device DV2-A. In certain embodiments, the underfill UF may be in physical contact with the third portions MX1-C of the metal layer MX1. In certain embodiments, the underfill UF may also be in physical contact with a surface 228-SX of the redistribution layer 228. Similar to the above embodiments, the thermal interface material layer 410 is mounted on the metal layer MX1, and a lid 420 is attached onto the circuit substrate 300 through an adhesive material 430. Furthermore, one or more passive components PDV (integrated passive device or surface mount devices) may be mounted on the circuit substrate 300 prior to the attachment of the lid 420. After attaching the lid 420 on the circuit substrate 300, the package structure PK4 according to some other embodiments of the disclosure may be accomplished.

Figure 9:
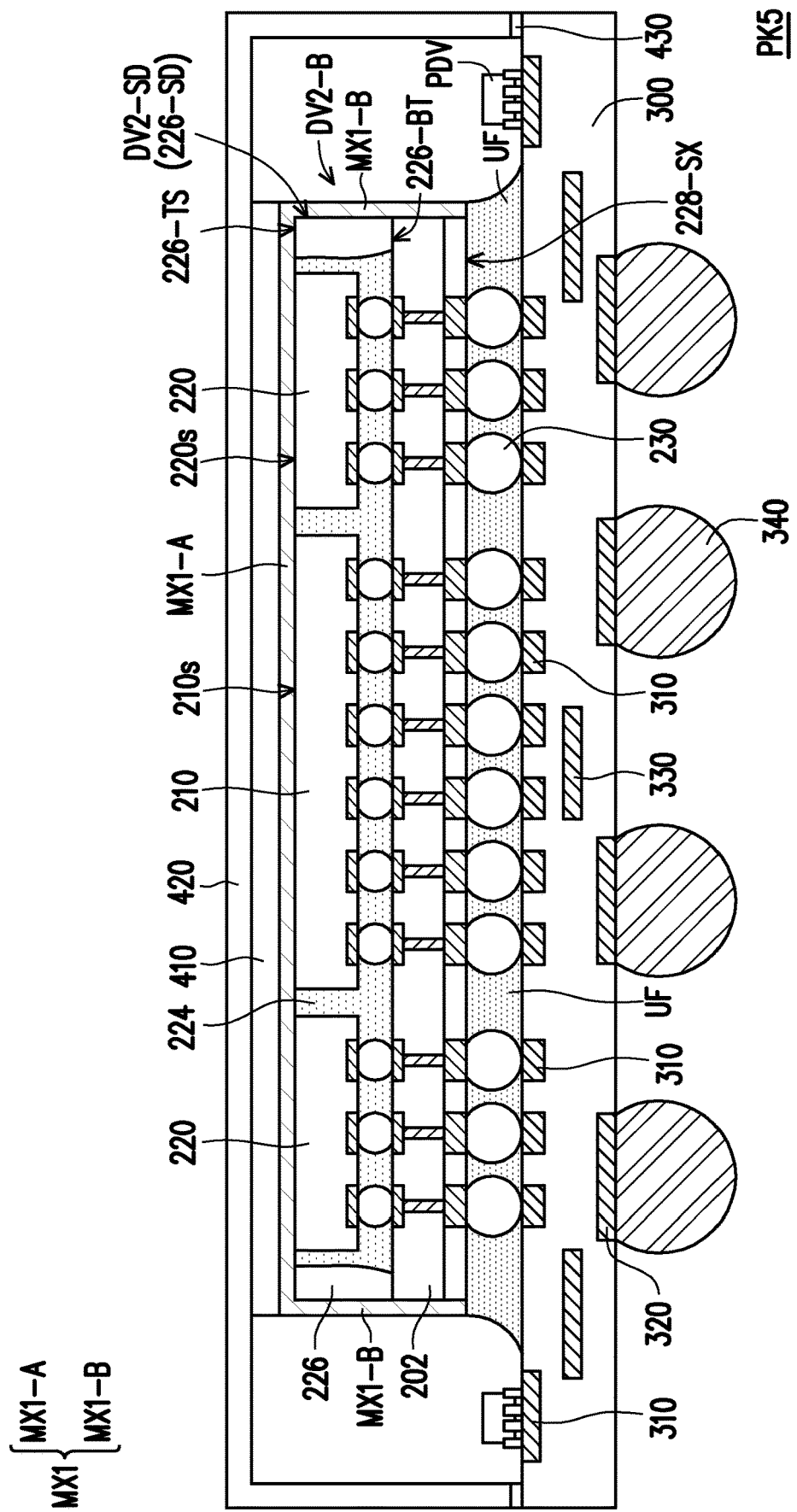
FIG. 9 is a schematic sectional view of a package structure according to some other exemplary embodiments of the present disclosure.

FIG. 9 is a schematic sectional view of a package structure according to some other exemplary embodiments of the present disclosure. The package structure PK5 illustrated in FIG. 9 is similar to the package structure PK2 illustrated in FIG. 3E. Therefore, the same reference numerals are used to refer to the same or liked parts, and its detailed description will be omitted herein. The difference between the embodiments is that a metal-coated device DV2-B in FIG. 9 is used in replacement of the metal-coated device DV1-B in FIG. 3E.

As illustrated in FIG. 9, a metal-coated device DV2-B is disposed on the circuit substrate 300. In the exemplary embodiment, the metal-coated device DV2-B may be obtained by forming a metal layer MX1 on the device DV2 shown in FIG. 7G. For example, the metal layer MX1 may be formed on the device DV2 using the same method described in FIG. 3A to FIG. 3D. In other words, a metal layer MX1 including a first portion MX1-A, and second portions MX1-B is formed on the device DV2. In some embodiments, the metal layer MX1 covers a top surface 226-TS of the insulating encapsulation 226. In some embodiments, the top surface 226-TS of the insulating encapsulation 226 is substantially leveled with the back surfaces 210s, 220s of the semiconductor dies 210, 220. In certain embodiments, the first portion MX1-A covers the top surface 226-TS of the insulating encapsulation 226, and covers the backside surface DV2-BS of the devices DV2. The second portions MX1-B covers side surfaces 226-SD of the insulating encapsulation 226 and covers the side surfaces DV2-SD of the devices DV2. In certain embodiments, a surface of the second portions MX1-B of the metal layer MX1 is aligned with a surface 228-SX of the redistribution layer 228.

In some embodiments, after bonding the metal-coated device DV2-B (device DV2 covered by metal layer MX1) onto the circuit substrate 300, an underfill UF is formed between the device DV2-B and the circuit substrate 300 to encapsulate the conductive terminals 230 of the device DV2-B. In certain embodiments, the underfill UF may be in physical contact with the second portions MX1-B of the metal layer MX1. In certain embodiments, the underfill UF may also be in physical contact with a surface 228-SX of the redistribution layer 228. Similar to the above embodiments, the thermal interface material layer 410 is mounted on the metal layer MX1, and a lid 420 is attached onto the circuit substrate 300 through an adhesive material 430. Furthermore, one or more passive components PDV (integrated passive device or surface mount devices) may be mounted on the circuit substrate 300 prior to the attachment of the lid 420. After attaching the lid 420 on the circuit substrate 300, the package structure PK5 according to some other embodiments of the disclosure may be accomplished.

Figure 10:
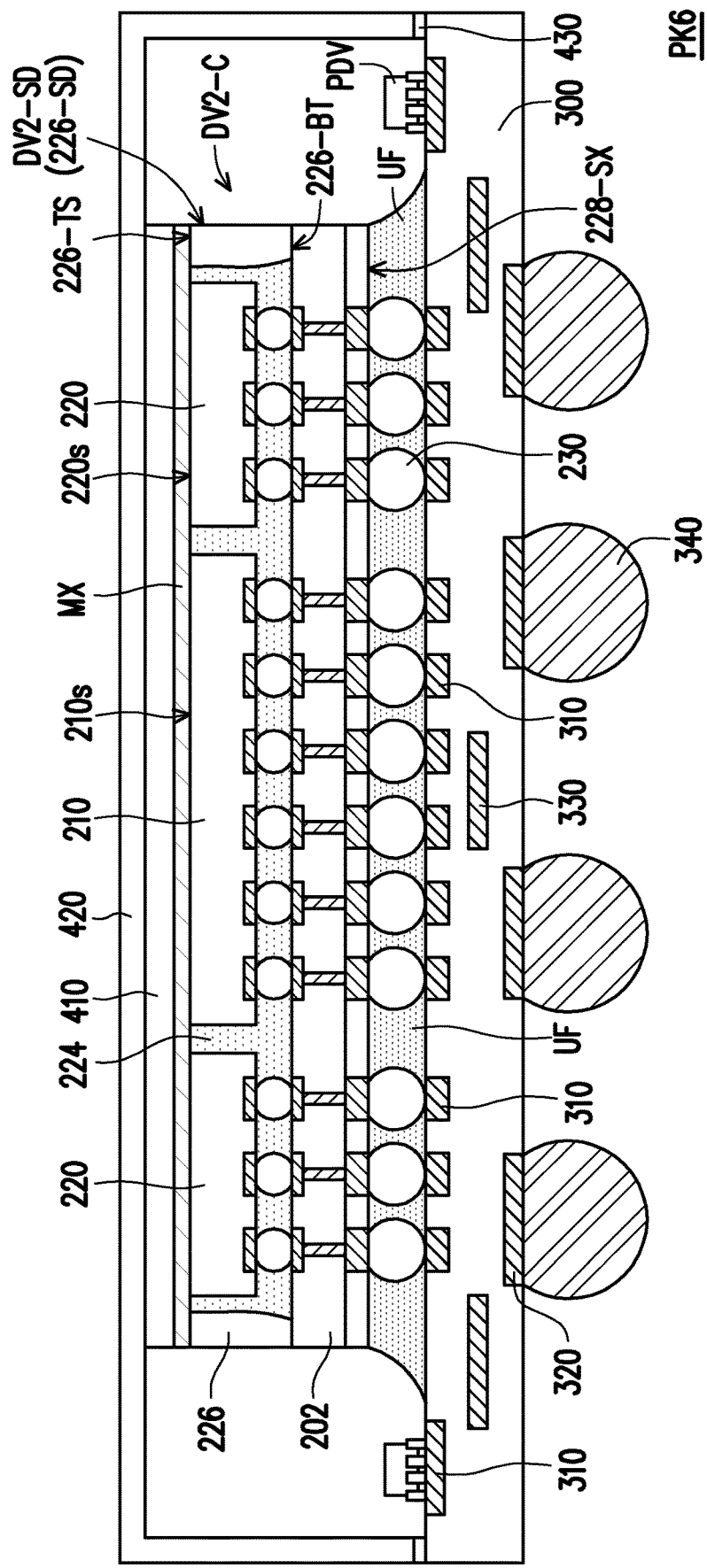
FIG. 10 is a schematic sectional view of a package structure according to some other exemplary embodiments of the present disclosure.

FIG. 10 is a schematic sectional view of a package structure according to some other exemplary embodiments of the present disclosure. The package structure PK6 illustrated in FIG. 10 is similar to the package structure PK3 illustrated in FIG. 6. Therefore, the same reference numerals are used to refer to the same or liked parts, and its detailed description will be omitted herein. The difference between the embodiments is that a metal-coated device DV2-C in FIG. 10 is used in replacement of the metal-coated device DV1-C in FIG. 6.

As illustrated in FIG. 10, a metal-coated device DV2-C is disposed on the circuit substrate 300. In the exemplary embodiment, the metal-coated device DV2-C may be obtained by forming a metallic material layer MX on the device DV2 shown in FIG. 7G. For example, the metallic material layer MX may be formed on the device DV2 using the same method described in FIG. 4A to FIG. 4B and FIG. 5A to FIG. 5B. For example, in some embodiments, the metallic material layer MX covers a top surface 226-TS of the insulating encapsulation 226. In some embodiments, the top surface 226-TS of the insulating encapsulation 226 is substantially leveled with the backside surfaces 210s, 220s of the semiconductor dies 210, 220. In certain embodiments, side surfaces of the metallic material layer MX is aligned with side surfaces 226-SD of the insulating encapsulation 226.

In some embodiments, after bonding the metal-coated device DV2-C (device DV2 covered by metallic material layer MX) onto the circuit substrate 300, an underfill UF is formed between the device DV2-C and the circuit substrate 300 to encapsulate the conductive terminals 230 of the device DV2-C. In certain embodiments, the underfill UF may be in physical contact with a surface 228-SX of the redistribution layer 228. Similar to the above embodiments, the thermal interface material layer 410 is mounted on the metallic material layer MX, and a lid 420 is attached onto the circuit substrate 300 through an adhesive material 430. Furthermore, one or more passive components PDV (integrated passive device or surface mount devices) may be mounted on the circuit substrate 300 prior to the attachment of the lid 420. After attaching the lid 420 on the circuit substrate 300, the package structure PK6 according to some other embodiments of the disclosure may be accomplished.

In the above-mentioned embodiments, a backside surface of a semiconductor die in a device is at least covered by a metal layer, and the lid is adhered to the metal layer through the thermal interface material layer. As a result, a heat dissipation of the device can be improved, and a delamination issue of the thermal interface material layer can be resolved. Overall, a package structure with improved reliability can be achieved.

In accordance with some embodiments of the present disclosure, a structure includes a circuit substrate, a device, a metal layer, a lid and a thermal interface material layer. The device is disposed on and electrically connected to the circuit substrate. The device includes at least one semiconductor die laterally encapsulated by an insulating encapsulation. The metal layer is covering a back surface of the at least one semiconductor die and the insulating encapsulation. The lid is disposed on the circuit substrate, and the lid is adhered to the metal layer through the thermal interface material layer.

In accordance with some other embodiments of the present disclosure, a method is described, the method includes the following steps. Devices are placed in cavities of a tray. A metallic material later is formed to cover the devices and the tray. At least one of the devices covered by the metallic material layer is picked up from the tray such that a metal layer of the metallic material layer is separated from a residue portion of the metallic material layer. The metal layer at least covers a back surface of the at least one of devices, and the residue portion covers the tray. At least one of the devices covered by the metal layer is mounted onto a circuit substrate. A lid is mounted on the circuit substrate, wherein the lid is adhered to the metal layer on the at least one of the devices through a thermal interface material layer.

In accordance with yet another embodiment of the present disclosure, a method is described, the method includes the following steps. Devices are placed on a tape. A metallic material layer is formed to cover the devices and the tap. At least one of the devices covered by the metallic material layer is picked up from the tape, such that a metal layer at least covering a back surface of the at least one of the devices is separated from a residue portion covering the tape. At least one of the devices covered by the metal layer is mounted onto a circuit substrate. A lid is mounted on the circuit substrate, wherein the lid is adhered to the metal layer on the at least one of the devices through a thermal interface material layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure, comprising:
    a circuit substrate;
    a device disposed on and electrically connected to the circuit substrate, the device comprising a plurality of semiconductor dies laterally encapsulated by an insulating encapsulation;
    a metal layer covering and directly contacting back surfaces of the plurality of semiconductor dies and a top surface of the insulating encapsulation, wherein the metal layer comprises a first portion covering the top surface and second portions covering side surfaces of the insulating encapsulation;
    a lid disposed on the circuit substrate; and
    a thermal interface material layer, wherein the lid is adhered to the metal layer through the thermal interface material layer.

2. The structure according to claim 1, wherein the lid covers the thermal interface material layer, the metal layer and the device, and an accommodating spacing is defined by the lid and the circuit substrate.

3. The structure according to claim 1, wherein the thermal interface material layer is disposed between and in contact with the lid and the metal layer, and the thermal interface material layer is spaced apart from the insulating encapsulation by the metal layer.

4. The structure according to claim 1, wherein the top surface of the insulating encapsulation is leveled with the back surfaces of the plurality of semiconductor dies.

5. The structure according to claim 1 further comprising an underfill disposed between the device and the circuit substrate, wherein the device comprises conductive terminals electrically connected to the circuit substrate, and the underfill encapsulates the conductive terminals, and the underfill is in contact with the second portions of the metal layer.

6. The structure according to claim 1, wherein the metal layer further comprises third portions partially covering a bottom surface of the insulating encapsulation, the top surface of the insulating encapsulation is leveled with the back surfaces of the plurality of semiconductor dies, and the bottom surface of the insulating encapsulation is opposite to the top surface of the insulating encapsulation.

7. The structure according to claim 6 further comprising an underfill disposed between the device and the circuit substrate, wherein the device comprises conductive terminals electrically connected to the circuit substrate, the underfill encapsulates the conductive terminals, and the underfill is in contact with the third portions of the metal layer.

8. The structure according to claim 6, wherein the third portions of the metal layer are spaced apart from the conductive terminals of the device.

9. A structure, comprising:
a first semiconductor die and a second semiconductor die;
a first insulating encapsulation encapsulating the first semiconductor die and the second semiconductor die;
a bridge structure electrically connecting the first semiconductor die to the second semiconductor die;
a second insulating encapsulation encapsulating the bridge structure, wherein side surfaces of the first insulating encapsulation are aligned with side surfaces the second insulating encapsulation;
a metal layer comprising a first portion and a second portion, wherein the first portion is covering back surfaces of the first semiconductor die and the second semiconductor die, and the second portion is covering the side surfaces of the first insulating encapsulation and the side surfaces the second insulating encapsulation; and
a redistribution layer disposed on and electrically connected to the bridge structure, the first semiconductor die and the second semiconductor die.

10. The structure according to claim 9, further comprising:
a dielectric layer sandwiched in between the first insulating encapsulation and the second insulating encapsulation; and
a conductive layer embedded in the dielectric layer and electrically connected to the bridge structure, the first semiconductor die and the second semiconductor die.

11. The structure according to claim 10, further comprising a plurality of conductive connectors embedded in the second insulating encapsulation and electrically connecting the conductive layer to the redistribution layer.

12. The structure according to claim 9, further comprising a plurality of conductive terminals disposed on and electrically connected to the redistribution layer, and electrically connecting the redistribution layer to a circuit substrate.

13. The structure according to claim 9, wherein the metal layer further comprises a third portion that partially covers a top surface of the redistribution layer.

14. A structure, comprising:
a plurality of semiconductor dies;
an insulating encapsulation laterally encapsulating the plurality of semiconductor dies;
conductive connectors disposed on and electrically connected to the plurality of semiconductor dies;
a metal layer disposed on and covering and contacting back surfaces of the plurality of semiconductor dies, and covering and contacting the insulating encapsulation;
a lid structure covering the plurality of semiconductor dies, the conductive connectors and the metal layer; and
a thermal interface material sandwiched between the metal layer and the lid structure, wherein sidewalls of the thermal interface material is aligned with sidewalls of the metal layer.

15. The structure according to claim 14, further comprises:
a redistribution layer disposed on the conductive connectors; and
a plurality of conductive terminals disposed on the redistribution layer.

16. The structure according to claim 15, wherein the metal layer comprises:
a first portion covering the back surfaces of the plurality of semiconductor dies;
a second portion covering sidewalls of the plurality of semiconductor dies and covering sidewalls of the conductive connectors; and
a third portion partially covering a top surface of the redistribution layer.

17. The structure according to claim 16, wherein the first portion has a thickness of T1, the second portion has a thickness of T2, and the third portion has at thickness of T3, and wherein a ratio of the thicknesses T2:T1 is in a range of 0.3:1 to 1:1, and a ratio of the thicknesses T3:T2 is in a range of 0.3:1 to 1:1.

18. The structure according to claim 15, further comprising:
a bridge structure disposed on the plurality of semiconductor dies;
a first underfill covering die connectors of the bridge structure; and
a second underfill covering the plurality of conductive terminals and directly contacting the metal layer.

19. The structure according to claim 14, wherein the plurality of semiconductor dies and the conductive connectors are disposed on a circuit substrate, and wherein the lid structure is attached to the circuit substrate.

20. The structure according to claim 14, further comprising a patterned conductive layer disposed in between the plurality of semiconductor dies and the conductive connectors.

* * * * *